US012659627B2

(12) United States Patent
Morikawa et al.

(10) Patent No.: US 12,659,627 B2
(45) Date of Patent: Jun. 16, 2026

(54) IMAGE SENSOR CIRCUIT

(71) Applicant: Sharp Semiconductor Innovation Corporation, Tenri City (JP)

(72) Inventors: Yoshinao Morikawa, Tenri City (JP); Takeo Ushinaga, Tenri City (JP)

(73) Assignee: Sharp Semiconductor Innovation Corporation, Tenri City (JP)

( * ) Notice: Subject to any disclaimer, the term of this patent is extended or adjusted under 35 U.S.C. 154(b) by 175 days.

(21) Appl. No.: 18/383,122

(22) Filed: Oct. 24, 2023

(65) Prior Publication Data

US 2024/0147100 A1 May 2, 2024

(30) Foreign Application Priority Data

Oct. 31, 2022 (JP) ................................. 2022-174438

(51) Int. Cl.
| | |
|---|---|
| *H04N 25/78* | (2023.01) |
| *H03M 1/14* | (2006.01) |
| *H04N 25/76* | (2023.01) |
| *H04N 25/77* | (2023.01) |

(52) U.S. Cl.
CPC ............ *H04N 25/78* (2023.01); *H03M 1/145* (2013.01); *H04N 25/76* (2023.01); *H04N 25/77* (2023.01); *H04N 25/7795* (2023.01)

(58) Field of Classification Search
CPC .... H04N 25/76; H04N 25/77; H04N 25/7795; H04N 25/78; H03M 1/00; H03M 1/001; H03M 1/12; H03M 1/14; H03M 1/145
See application file for complete search history.

(56) References Cited

U.S. PATENT DOCUMENTS

| | | |
|---|---|---|
| 2005/0195238 A1 | 9/2005 | Eguchi et al. |
| 2005/0206548 A1 | 9/2005 | Muramatsu et al. |
| 2006/0097902 A1 | 5/2006 | Muramatsu et al. |
| 2007/0019091 A1 | 1/2007 | Muramatsu et al. |
| 2007/0024728 A1 | 2/2007 | Muramatsu et al. |
| 2007/0024729 A1 | 2/2007 | Muramatsu et al. |
| 2007/0024730 A1 | 2/2007 | Muramatsu et al. |
| 2007/0024731 A1 | 2/2007 | Muramatsu et al. |
| 2007/0030187 A1 | 2/2007 | Muramatsu et al. |
| 2008/0231491 A1 | 9/2008 | Muramatsu et al. |

(Continued)

FOREIGN PATENT DOCUMENTS

JP          4470700 B2        6/2010

*Primary Examiner* — Lin Ye
*Assistant Examiner* — Chriss S Yoder, III
(74) *Attorney, Agent, or Firm* — ScienBiziP, P.C.

(57) ABSTRACT

An image sensor circuit includes a plurality of column analog/digital conversion circuits each including: first to n-th storage elements configured to respectively store first to n-th pieces of bit data that constitute analog/digital-converted data obtained by analog/digital-converting analog signals outputted by pixels, where n is an integer greater than or equal to 2; first to (n−1)-th transfer paths configured to respectively transfer the bit data stored in the first to (n−1)-th storage elements from the first to (n−1)-th storage elements to the second to n-th storage elements; and an n-th transfer path configured to transfer the bit data stored in the n-th storage element from the n-th storage element to outside the plurality of column analog/digital conversion circuits.

10 Claims, 20 Drawing Sheets

(56)                References Cited

U.S. PATENT DOCUMENTS

2013/0121455 A1*   5/2013   Koyama ............... H03M 1/502
                                                        377/54
2015/0124926 A1*   5/2015   Choi ...................... H03K 21/10
                                                        377/53
2021/0144324 A1*   5/2021   Hynecek ................ H10F 39/18

* cited by examiner

FIG. 11

INPUT DIRECTION OF ANALOG SIGNAL

POST-STAGE LOGIC CIRCUIT

IMAGE SENSOR CIRCUIT

FIELD OF THE INVENTION

The present disclosure relates to image sensor circuits. The present application hereby claims priority to Japanese Patent Application, No. 2022-174438 filed Oct. 31, 2022, the contents of which are incorporated herein by reference.

BACKGROUND OF THE INVENTION

Japanese Patent No. 4470700 discloses a CMOS image sensor. In this CMOS image sensor, n-bit pixel data is latched by an n-bit latch in a column AD circuit and fed to an output circuit via n horizontal signal lines (paragraphs 0012, 0015, and 0036).

SUMMARY OF THE INVENTION

In the CMOS image sensor disclosed in Japanese Patent No. 4470700, the n horizontal signal lines occupy a large area.

This problem is pronounced when the horizontal signal lines have a parallel structure in order to increase the frame rate of the CMOS image sensor.

The present disclosure, in an aspect thereof, has been made in view of the problem and has an object to provide, for example, an image sensor circuit that operates at high speed and that occupies only a small area.

The present disclosure, in an aspect thereof, is directed to an image sensor circuit including a plurality of column analog/digital conversion circuits each including: first to n-th storage elements configured to respectively store first to n-th pieces of bit data that constitute analog/digital-converted data obtained by analog/digital-converting analog signals outputted by pixels, where n is an integer greater than or equal to 2; first to (n−1)-th transfer paths configured to respectively transfer the bit data stored in the first to (n−1)-th storage elements from the first to (n−1)-th storage elements to the second to n-th storage elements; and an n-th transfer path configured to transfer the bit data stored in the n-th storage element from the n-th storage element to outside the plurality of column analog/digital conversion circuits.

BRIEF DESCRIPTION OF DRAWINGS

FIG. 11 is a circuit diagram of a second example of each shift register circuit in the CMOS image sensor in accordance with Embodiment 3.

DESCRIPTION OF EMBODIMENTS

Figure 1A:
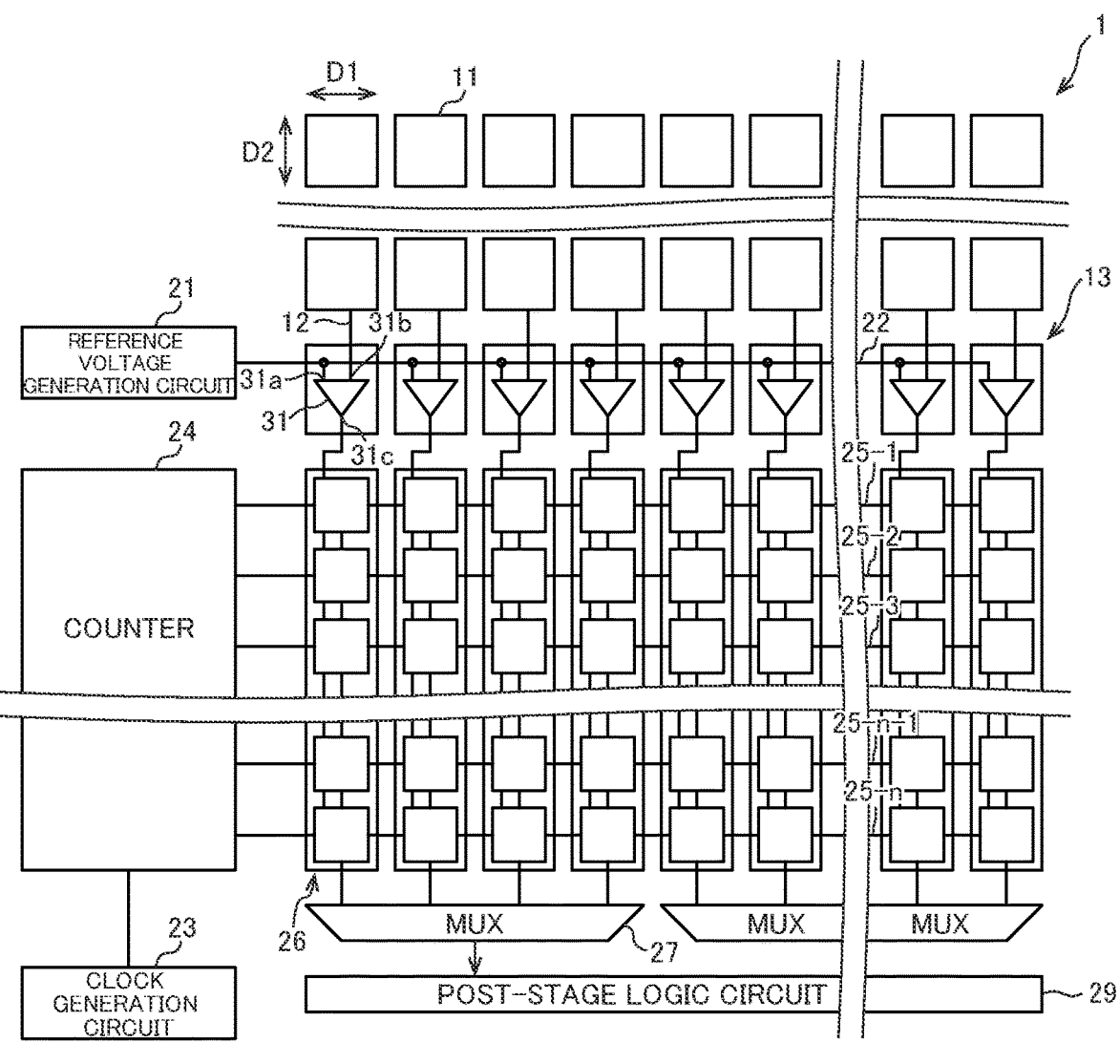
FIG. 1A is a block diagram of a complementary metal oxide semiconductor (CMOS) image sensor in accordance with Embodiment 1.

The following will describe embodiments of the present disclosure with reference to drawings. Identical and equivalent elements in the drawings are denoted by the same reference numerals, and description thereof is not repeated.

1 Embodiment 1

1.1 CMOS Image Sensor

Figure 1B:
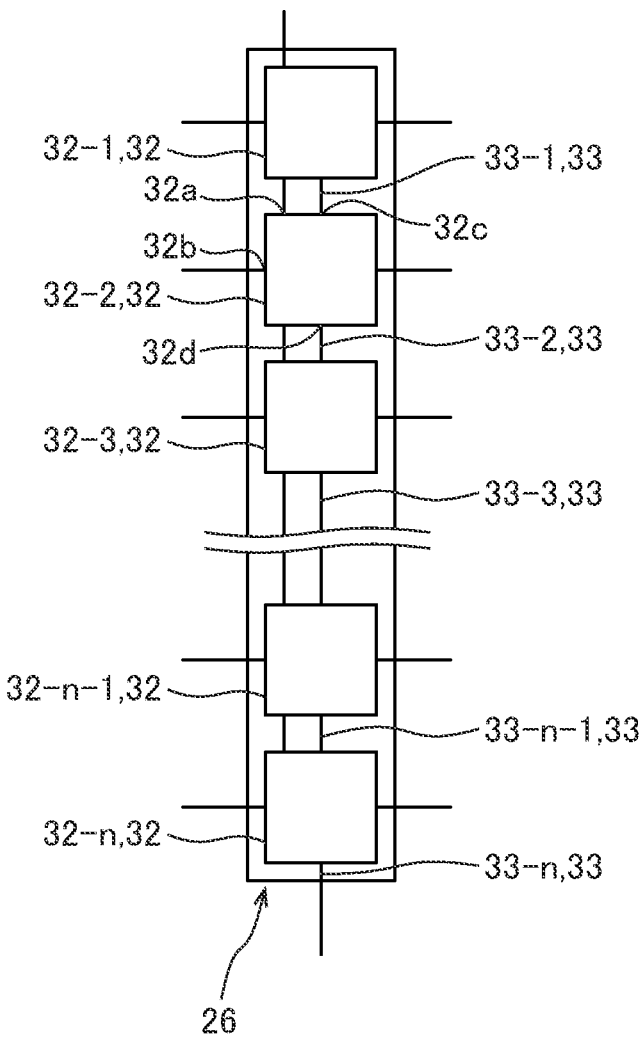
FIG. 1B is an enlarged view of a part of FIGS. 1A, 8, and 9.

FIG. 1A is a block diagram of a complementary metal oxide semiconductor (CMOS) image sensor in accordance with Embodiment 1. FIG. 1B is an enlarged view of a part of FIG. 1A.

A CMOS image sensor 1 in accordance with Embodiment 1 shown in FIG. 1A captures an image of a subject to output image data in accordance with the captured image of the subject.

Referring to FIG. 1A, the CMOS image sensor 1 includes p×q pixels 11, p vertical signal lines 12, and an image sensor circuit 13, where p and q are integers greater than or equal to 2.

The p×q pixels 11 are arranged in a matrix, where p is the number of those pixels 11 that are arranged in a row direction D1, and q is the number of those pixels 11 that are arranged in a column direction D2. Each of the p×q pixels 11 outputs an analog signal in accordance with incoming light.

The p vertical signal lines 12 respectively transfer, from the p pixels 11 to the image sensor circuit 13, p analog signals outputted from those p pixels 11 that belong to the line sequentially selected from the q lines. This structure enables the p vertical signal lines 12 to respectively transfer, to the image sensor circuit 13, the p×q analog signals outputted from the p×q pixels 11.

The image sensor circuit 13 generates image data from the incoming p×q analog signals to output the generated image data to the outside of the CMOS image sensor 1.

1.2 Image Sensor Circuit

Referring to FIG. 1A, the image sensor circuit 13 includes a reference voltage generation circuit 21, a reference voltage transfer line 22, a clock generation circuit 23, a counter 24, first to n-th count code symbol transfer lines 25-1, 25-2, 25-3, . . . , 25-n–1, and 25-n, p column analog/digital (A/D) conversion circuits 26, a plurality of multiplex (MUX) circuits 27, and a post-stage logic circuit 29, where n is an integer greater than or equal to 2.

The reference voltage generation circuit 21 generates a reference voltage that increases or decreases with time.

The reference voltage transfer line 22 transfers the generated reference voltage from the reference voltage generation circuit 21 to the respective column A/D conversion circuits 26 in the p column A/D conversion circuits 26.

The clock generation circuit 23 generates a clock.

The counter 24 counts the number of clock pulses on the generated clock to generate a count code symbol that represents the count. The count code symbol is an n-bit sequence. Therefore, the count code symbol contains first to n-th pieces of bit data.

The first to n-th count code symbol transfer lines 25-1, 25-2, 25-3, . . . , 25-n–1, and 25-n respectively transfer the first to n-th pieces of bit data that constitute the generated count code symbols from the counter 24 to the column A/D conversion circuits 26.

The p column A/D conversion circuits 26 are respectively fed with p analog signals outputted from the p pixels 11 that belong to the selected line. Each column A/D conversion circuit 26 in the p column A/D conversion circuits 26 stores the first to n-th pieces of bit data that constitute the count code symbols that have been generated when the transferred reference voltage reaches a voltage of the inputted analog signal. Hence, each column A/D conversion circuit 26 stores the first to n-th pieces of bit data that constitute the A/D-converted data obtained by A/D-converting the inputted analog signal.

Each MUX circuit 27 in the plurality of MUX circuits 27 is serially fed with the first to n-th pieces of bit data from each one of at least two column A/D conversion circuits 26 included in the p column A/D conversion circuits 26. Each MUX circuit 27 serially outputs the first to n-th pieces of bit data that are serially inputted from one of the column A/D conversion circuits 26 that is selected from the at least two column A/D conversion circuits 26 and serially inputs the serially outputted, first to n-th pieces of bit data to the post-stage logic circuit 29. Each MUX circuit 27 sequentially switches the selected one of the column A/D conversion circuits 26. Hence, the plurality of MUX circuits 27 serially output the first to n-th pieces of bit data for all the p×q pixels 11.

The post-stage logic circuit 29 processes the serially inputted, first to n-th pieces of bit data. The post-stage logic circuit 29 generates image data by processing the first to n-th pieces of bit data for all the p×q pixels 11, to output the generated image data to the outside of the CMOS image sensor 1.

1.3 Column A/D Conversion Circuit

Referring to FIGS. 1A and 1B, each column A/D conversion circuit 26 includes a comparator 31, first to n-th storage elements 32-1, 32-2, 32-3, . . . , 32-n–1, and 32-n, and first to n-th transfer paths 33-1, 33-2, 33-3, . . . , 33-n–1, and 33-n. The comparator 31 has a first input terminal 31a, a second input terminal 31b, and an output terminal 31c. Each storage element 32 in the first to n-th storage elements 32-1, 32-2, 32-3, . . . , 32-n–1, and 32-n has an enable terminal 32a, a first input terminal 32b, a second input terminal 32c, and an output terminal 32d.

Figure 2:
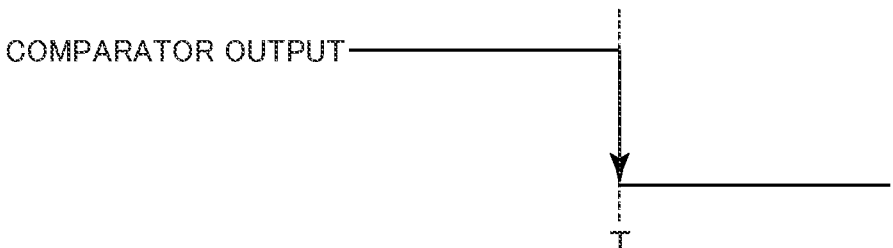
FIG. 2 is a time chart illustrating an exemplary temporal change in the output of a comparator in the CMOS image sensor in accordance with Embodiment 1.

FIG. 2 is a time chart illustrating an exemplary temporal change in the output of a comparator in the CMOS image sensor in accordance with Embodiment 1.

The comparator 31 outputs a first logic value "1" from the output terminal 31c when the voltage fed through the first input terminal 31a is higher than the voltage fed through the second input terminal 31b. On the other hand, the comparator 31 outputs a second logic value "0" from the output terminal 31c when the voltage fed through the first input terminal 31a is lower than the voltage fed through the second input terminal 31b.

The comparator 31 is electrically connected to the reference voltage transfer line 22 at the first input terminal 31a. Hence, the first input terminal 31a is fed with the reference voltage transferred by the reference voltage transfer line 22. The comparator 31 is electrically connected to one of the vertical signal lines 12 at the second input terminal 31b. Hence, the second input terminal 31b is fed with the voltage of the analog signal transferred by the vertical signal line 12.

Hence, the comparator 31 inverts the logic value when the reference voltage reaches the voltage of the analog signal and either rises above or falls below the voltage of the analog signal. Referring to FIG. 2, the comparator 31 inverts the logic value from the first logic value "1" to the second logic value "0" at a timing T at which the reference voltage changes from above the voltage of the analog signal to below the voltage of the analog signal.

Each storage element 32 is enabled while the first logic value "1" is being inputted to the enable terminal 32a. On the other hand, the storage element 32 is disabled while the second logic value "0" is being inputted to the enable terminal 32a.

The storage element 32, while being enabled, outputs, through the output terminal 32d, the bit data being currently fed to the first input terminal 32b as such. Meanwhile, the storage element 32, while being disabled, retains the bit data being fed to the first input terminal 32b at the timing T at which the storage element 32 was disabled, to output the retained bit data through the output terminal 32d. The storage element 32, even while being disabled, is capable of retaining the bit data fed to the second input terminal 32c and outputting the retained bit data through the output terminal 32d.

The enable terminal 32a in each storage element 32 is electrically connected to the output terminal 31c of the comparator 31. Hence, the storage element 32 is fed through the enable terminal 32a with the logic value outputted from the output terminal 31c of the comparator 31. The first input terminals 32b of the first to n-th storage elements 32-1, 32-2, 32-3, . . . , 32-n–1, and 32-n are electrically connected respectively to the first to n-th count code symbol transfer lines 25-1, 25-2, 25-3, . . . , 25-n–1, and 25-n. Hence, the first input terminals 32b of the first to n-th storage elements 32-1,

32-2, 32-3, . . . , 32-*n*–1, and 32-*n* are respectively fed with the first to n-th pieces of bit data transferred by the first to n-th count code symbol transfer lines 25-1, 25-2, 25-3, . . . , 25-*n*–1, and 25-*n*.

Hence, the first to n-th storage elements 32-1, 32-2, 32-3, . . . , 32-*n*–1, and 32-*n* respectively retain the first to n-th pieces of bit data generated by the counter 24 at the timing T at which the logic value outputted from the output terminal 31*c* of the comparator 31 is inverted from the first logic value "1" to the second logic value "0" to respectively output the retained, first to n-th pieces of bit data through the output terminal 32*d*. Hence, the first to n-th storage elements 32-1, 32-2, 32-3, . . . , 32-*n*–1, and 32-*n* respectively store the first to n-th pieces of bit data that constitute the A/D-converted data obtained by A/D-converting the analog signals outputted by the pixels 11.

Each storage element 32 is a latch circuit. Each storage element 32 may be a storage element other than a latch circuit.

The first to (n–1)-th transfer paths 33-1, 33-2, 33-3, . . . , 33-*n*–1, and 33-*n* respectively transfer bit data from ends of the first to (n–1)-th transfer paths 33-1, 33-2, 33-3, . . . , and 33-*n*–1 to the other ends of the first to (n–1)-th transfer paths 33-1, 33-2, 33-3, . . . , and 33-*n*–1.

The ends of the first to (n–1)-th transfer paths 33-1, 33-2, 33-3, . . . , and 33-*n*–1 are electrically connected respectively to the output terminals 32*d* of the first to (n–1)-th storage elements 32-1, 32-2, 32-3, . . . , 32-*n*–1. The other ends of the first to (n–1)-th transfer paths 33-1, 33-2, 33-3, . . . , and 33-*n*–1 are electrically connected to the second input terminals 32*c* of the second to n-th storage elements 32-2, 32-3, . . . , 32-*n*–1, and 32-*n*.

Hence, the first to (n–1)-th transfer paths 33-1, 33-2, 33-3, . . . , and 33-*n*–1 electrically connect the second input terminals 32*c* of the second to n-th storage elements 32-2, 32-3, . . . , 32-*n*–1, and 32-*n* respectively to the output terminals 32*d* of the adjacent first to (n–1)-th storage elements 32-1, 32-2, 32-3, . . . , 32-*n*–1. Hence, the first to (n–1)-th transfer paths 33-1, 33-2, 33-3, . . . , and 33-*n*–1 respectively transfer the bit data stored in the first to (n–1)-th storage elements 32-1, 32-2, 32-3, . . . , 32-*n*–1 from the first to (n–1)-th storage elements 32-1, 32-2, 32-3, . . . , 32-*n*–1 to the second to n-th storage elements 32-2, 32-3, . . . , 32-*n*–1, and 32-*n*.

The n-th transfer path 33-*n* transfers bit data from an end of the n-th transfer path 33-*n* to the other end of the n-th transfer path 33-*n*.

The n-th transfer path 33-*n* is electrically connected at an end thereof to the output terminal 32*d* of the n-th storage element 32-*n*. The n-th transfer path 33-*n* is electrically connected at the other end thereof to the MUX circuit 27.

Hence, the n-th transfer path 33-*n* electrically connects the MUX circuit 27 to the output terminal 32*d* of the n-th storage element 32-*n*. Hence, the n-th transfer path 33-*n* transfers the bit data stored in the n-th storage element 32-*n* from the n-th storage element 32-*n* to the MUX circuit 27 outside each column A/D conversion circuit 26.

The first to n-th storage elements 32-1, 32-2, 32-3, . . . , 32-*n*–1, and 32-*n* and the first to n-th transfer paths 33-1, 33-2, 33-3, . . . , 33-*n*–1, and 33-*n* transfer the A/D-converted data in a vertical direction that is parallel to the column direction D2, which differs from an H scan bus that transfers the A/D-converted data in a horizontal direction that is parallel to the row direction D1. Therefore, these elements and paths transfer the A/D-converted data in the same direction ss the direction in which the vertical signal lines 12 transfer analog signals. Therefore, the elements and paths are able to address the problems of a circuit called an H scan that is used in the transfer of the A/D-converted data in the horizontal direction.

1.4 Storage Element

Figure 3:
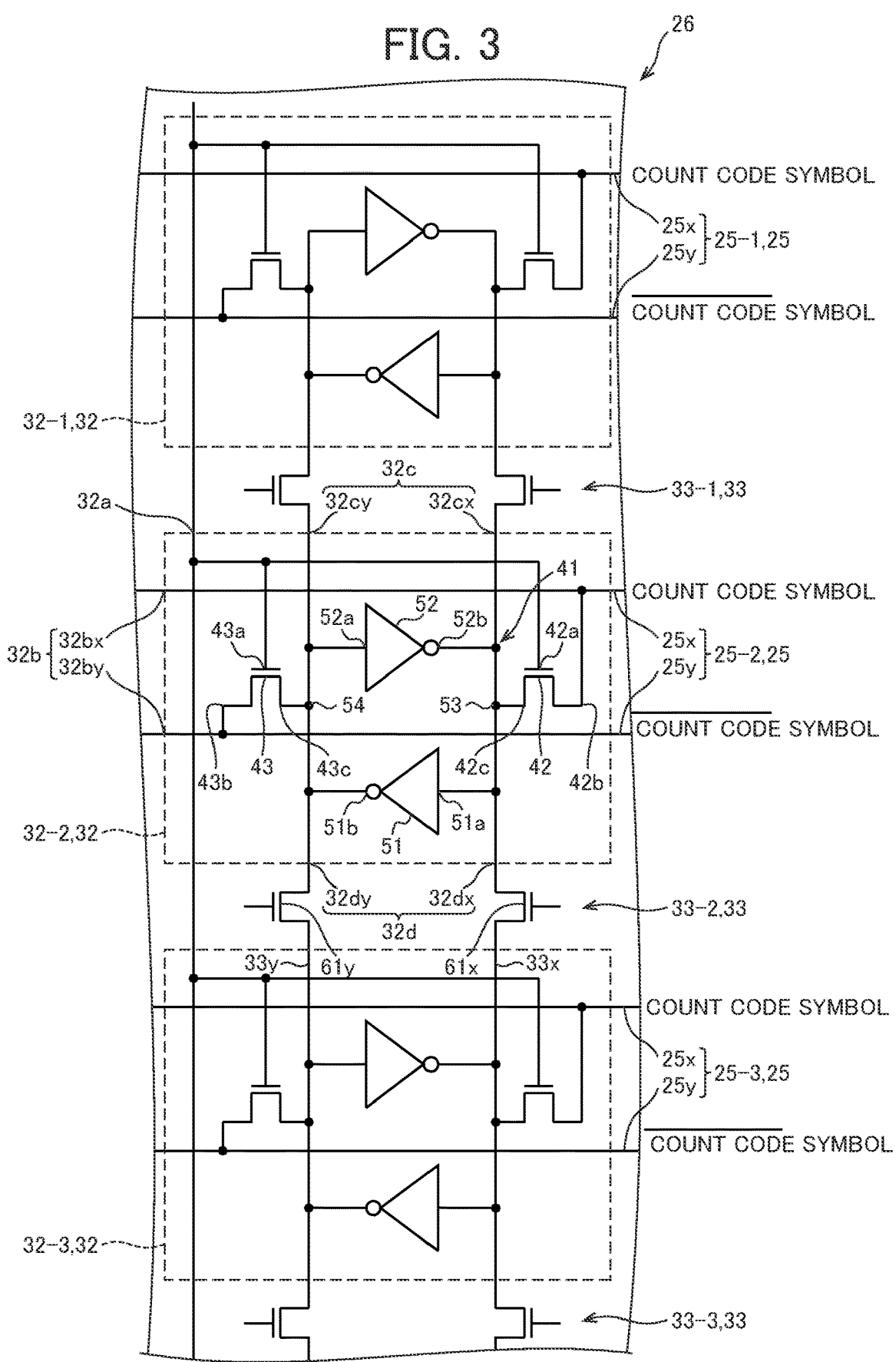
FIG. 3 is a circuit diagram of each column A/D conversion circuit in the CMOS image sensor in accordance with Embodiment 1.

FIG. 3 is a circuit diagram of each column A/D conversion circuit in the CMOS image sensor in accordance with Embodiment 1.

Referring to FIG. 3, each storage element 32 includes a retention circuit 41, a first switch 42, and a second switch 43. Each count code symbol transfer line 25 includes a non-inverting count code symbol transfer line 25*x* and an inverting count code symbol transfer line 25*y*. The first input terminal 32*b* of the storage element 32 includes a first non-inverting input terminal 32*bx* and a first inverting input terminal 32*by*. The second input terminal 32*c* of the storage element 32 includes a second non-inverting input terminal 32*cx* and a second inverting input terminal 32*cy*. The output terminal 32*d* of the storage element 32 includes a non-inverting output terminal 32*dx* and an inverting output terminal 32*dy*. Each transfer path 33 in the first to n-th transfer paths 33-1, 33-2, 33-3, . . . , 33-*n*–1, and 33-*n* includes a non-inverting transfer path 33*x* and an inverting transfer path 33*y*.

Referring to FIG. 3, the retention circuit 41 includes a first inverter 51, a second inverter 52, a non-inverting node 53, and an inverting node 54. The first inverter 51 includes an input terminal 51*a* and an output terminal 51*b*. The second inverter 52 includes an input terminal 52*a* and an output terminal 52*b*.

The first inverter 51 outputs, through the output terminal 51*b*, the bit data obtained by inverting the bit data fed through the input terminal 51*a*. The second inverter 52 outputs, through the output terminal 52*b*, the bit data obtained by inverting the bit data fed through the input terminal 52*a*.

The input terminal 51*a* of the first inverter 51 and the output terminal 52*b* of the second inverter 52 are electrically connected to the non-inverting node 53. The output terminal 51*b* of the first inverter 51 and the input terminal 52*a* of the second inverter 52 are electrically connected to the inverting node 54. The first inverter 51 and the second inverter 52 are electrically connected in inverse parallel with each other.

Hence, the retention circuit 41 is capable of retaining bit data. The non-inverting node 53 and the inverting node 54 have an electrical potential in accordance with the bit data retained by the retention circuit 41, in other words, the bit data stored by the storage element 32. The non-inverting node 53 and the inverting node 54 have complementary electrical potentials. The non-inverting node 53 and the inverting node 54 have a first electrical potential H and a second electrical potential L respectively when the storage element 32 contains a bit data "1." Meanwhile, the non-inverting node 53 and the inverting node 54 have the second electrical potential L and the first electrical potential H respectively when the storage element 32 contains a bit data "0." The non-inverting node 53 and the inverting node 54 are electrically connected to the second non-inverting input terminal 32*cx* and the second inverting input terminal 32*cy* of the storage element 32 respectively. The non-inverting node 53 and the inverting node 54 are electrically connected to the non-inverting output terminal 32*dx* and the inverting output terminal 32*dy* of the storage element 32 respectively. Hence, the retention circuit 41 is capable of retaining the bit data fed through the second input terminal 32*c* of the storage element 32 and outputting the retained bit data from the output terminal 32*d* of the storage element 32.

Referring to FIG. 3, the first switch 42 has a control terminal 42*a*, a first terminal 42*b*, and a second terminal 42*c*. The second switch 43 has a control terminal 43*a*, a first terminal 43*b*, and a second terminal 43*c*.

While the control terminal 42*a* is being fed with the first logic value "1," the first switch 42 is ON, which electrically connects the second terminal 42*c* to the first terminal 42*b*. Meanwhile, while the control terminal 42*a* is being fed with the second logic value "0," the first switch 42 is OFF, which electrically disconnects the second terminal 42*c* from the first terminal 42*b*. While the control terminal 43*a* is being fed with the first logic value "1," the second switch 43 is ON, which electrically connects the second terminal 43*c* to the first terminal 43*b*. While the control terminal 43*a* is being fed with the second logic value "0," the second switch 43 is OFF, which electrically disconnects the second terminal 43*c* from the first terminal 43*b*.

The control terminal 42*a* of the first switch 42 and the control terminal 43*a* of the second switch 43 are electrically connected to the enable terminal 32*a* of the storage element 32. The first terminal 42*b* of the first switch 42 is electrically connected to the first non-inverting input terminal 32*bx* of the storage element 32. The second terminal 42*c* of the first switch 42 is electrically connected to the non-inverting node 53. The first terminal 43*b* of the second switch 43 is electrically connected to the first inverting input terminal 32*by* of the storage element 32. The second terminal 43*c* of the second switch 43 is electrically connected to the inverting node 54. Hence, while the enable terminal 32*a* is being fed with the first logic value "1," each storage element 32 outputs, through the output terminal 32*d*, the bit data being currently fed to the first input terminal 32*b*. Meanwhile, while the enable terminal 32*a* is being fed with the second logic value "0," each storage element 32 retains the bit data being fed to the first input terminal 32*b* at the timing T at which the second logic value "0" started to be fed, to output the retained bit data through the output terminal 32*d*.

The first non-inverting input terminal 32*bx* and the first inverting input terminal 32*by* of each storage element 32 are electrically connected respectively to the non-inverting count code symbol transfer line 25*x* and the inverting count code symbol transfer line 25*y*. The non-inverting count code symbol transfer lines 25*x* of the first to n-th count code symbol transfer lines 25-1, 25-2, 25-3, ..., 25-*n*−1, and 25-*n* transfer the first to n-th pieces of bit data respectively. The inverting count code symbol transfer lines 25*y* of the first to n-th count code symbol transfer lines 25-1, 25-2, 25-3, ..., 25-*n*−1, and 25-*n* transfer the bit data obtained by inverting the first to n-th pieces of bit data respectively. Hence, the first non-inverting input terminals 32*bx* of the first to n-th storage elements 32-1, 32-2, 32-3, ..., 32-*n*−1, and 32-*n* are fed with the first to n-th pieces of bit data respectively. The first inverting input terminals 32*by* of the first to n-th storage elements 32-1, 32-2, 32-3, ..., 32-*n*−1, and 32-*n* are fed with the bit data obtained by inverting the first to n-th pieces of bit data respectively.

Referring to FIG. 3, the non-inverting transfer path 33*x* includes a switch circuit 61*x*. The inverting transfer path 33*y* includes a switch circuit 61*y*.

The switch circuit 61*x* assumes a state selected from an ON state in which another end of the non-inverting transfer path 33*x* is electrically connected to an end of the non-inverting transfer path 33*x* and an OFF state in which the other end of the non-inverting transfer path 33*x* is electrically disconnected to the end of the non-inverting transfer path 33*x*. The switch circuit 61*y* assumes a state selected from an ON state in which another end of the inverting transfer path 33*y* is electrically connected to an end of the inverting transfer path 33*y* and an OFF state in which the other end of the inverting transfer path 33*y* is electrically disconnected from the end of the inverting transfer path 33*y*.

Ends of the non-inverting transfer paths 33*x* of the first to (n−1)-th transfer paths 33-1, 33-2, 33-3, ..., and 33-*n*−1 are electrically connected to the non-inverting output terminals 32*dx* of the first to (n−1)-th storage elements 32-1, 32-2, 32-3, ..., 32-*n*−1 respectively. Other ends of the non-inverting transfer paths 33*x* of the first to (n−1)-th transfer paths 33-1, 33-2, 33-3, ..., and 33-*n*−1 are electrically connected to the second non-inverting input terminals 32*cx* of the second to n-th storage elements 32-2, 32-3, ..., 32-*n*−1, and 32-*n* respectively. Ends of the inverting transfer paths 33*y* of the first to (n−1)-th transfer paths 33-1, 33-2, 33-3, ..., and 33-*n*−1 are electrically connected to the inverting output terminals 32*dy* of the first to (n−1)-th storage elements 32-1, 32-2, 32-3, ..., 32-*n*−1 respectively. Other ends of the inverting transfer path 33*y* of the first to (n−1)-th transfer paths 33-1, 33-2, 33-3, ..., and 33-*n*−1 is electrically connected to the second inverting input terminal 32*cy* of the second to n-th storage elements 32-2, 32-3, ..., 32-*n*−1, and 32-*n* respectively.

Hence, the switch circuits 61*x* for the first to (n−1)-th transfer paths 33-1, 33-2, 33-3, ..., and 33-*n*−1 assume a state selected from an ON state in which the non-inverting nodes 53 in the second to n-th storage elements 32-2, 32-3, ..., 32-*n*−1, and 32-*n* are electrically connected respectively to the non-inverting nodes 53 in the first to (n−1)-th storage elements 32-1, 32-2, 32-3, ..., 32-*n*−1 and an OFF state in which the non-inverting nodes 53 in the second to n-th storage elements 32-2, 32-3, ..., 32-*n*−1, and 32-*n* are electrically disconnected respectively from the non-inverting nodes 53 in the first to (n−1)-th storage elements 32-1, 32-2, 32-3, ..., 32-*n*−1. The switch circuits 61*y* for the first to (n−1)-th transfer paths 33-1, 33-2, 33-3, ..., and 33-*n*−1 assume a state selected from an ON state in which the inverting nodes 54 of the second to n-th storage elements 32-2, 32-3, ..., 32-*n*−1, and 32-*n* are electrically connected respectively to the switch circuits 61*y* in the first to (n−1)-th storage elements 32-1, 32-2, 32-3, ..., 32-*n*−1 and an OFF state in which the inverting nodes 54 of the second to n-th storage elements 32-2, 32-3, ..., 32-*n*−1, and 32-*n* are electrically disconnected from the switch circuits 61*y* in the first to (n−1)-th storage elements 32-1, 32-2, 32-3, ..., 32-*n*−1.

An end of the non-inverting transfer path 33*x* of the n-th transfer path 33-*n* is electrically connected to the non-inverting output terminal 32*dx* of the n-th storage element 32-*n*. Another end of the non-inverting transfer path 33*x* of the n-th transfer path 33-*n* is electrically connected to the MUX circuit 27. An end of the inverting transfer path 33*y* of the n-th transfer path 33-*n* is electrically connected to the inverting output terminal 32*dy* of the n-th storage element 32-*n*. Another end of the inverting transfer path 33*y* of the n-th transfer path 33-*n* is electrically connected to the MUX circuit 27.

Hence, the switch circuit 61*x* for the n-th transfer path 33-*n* assumes a state selected from an ON state in which the MUX circuit 27 is electrically connected to the non-inverting node 53 of the n-th storage element 32-*n* and an OFF state in which the MUX circuit 27 is electrically disconnected from the non-inverting node 53 of the n-th storage element 32-*n*. The switch circuit 61*y* for the n-th transfer path 33-*n* assumes a state selected from an ON state in which the MUX circuit 27 is electrically connected to the inverting node 54 of the n-th storage element 32-*n* and an OFF state in which the MUX circuit 27 is electrically disconnected from the inverting node 54 of the n-th storage element 32-*n*.

1.5 Controller

Figure 4:
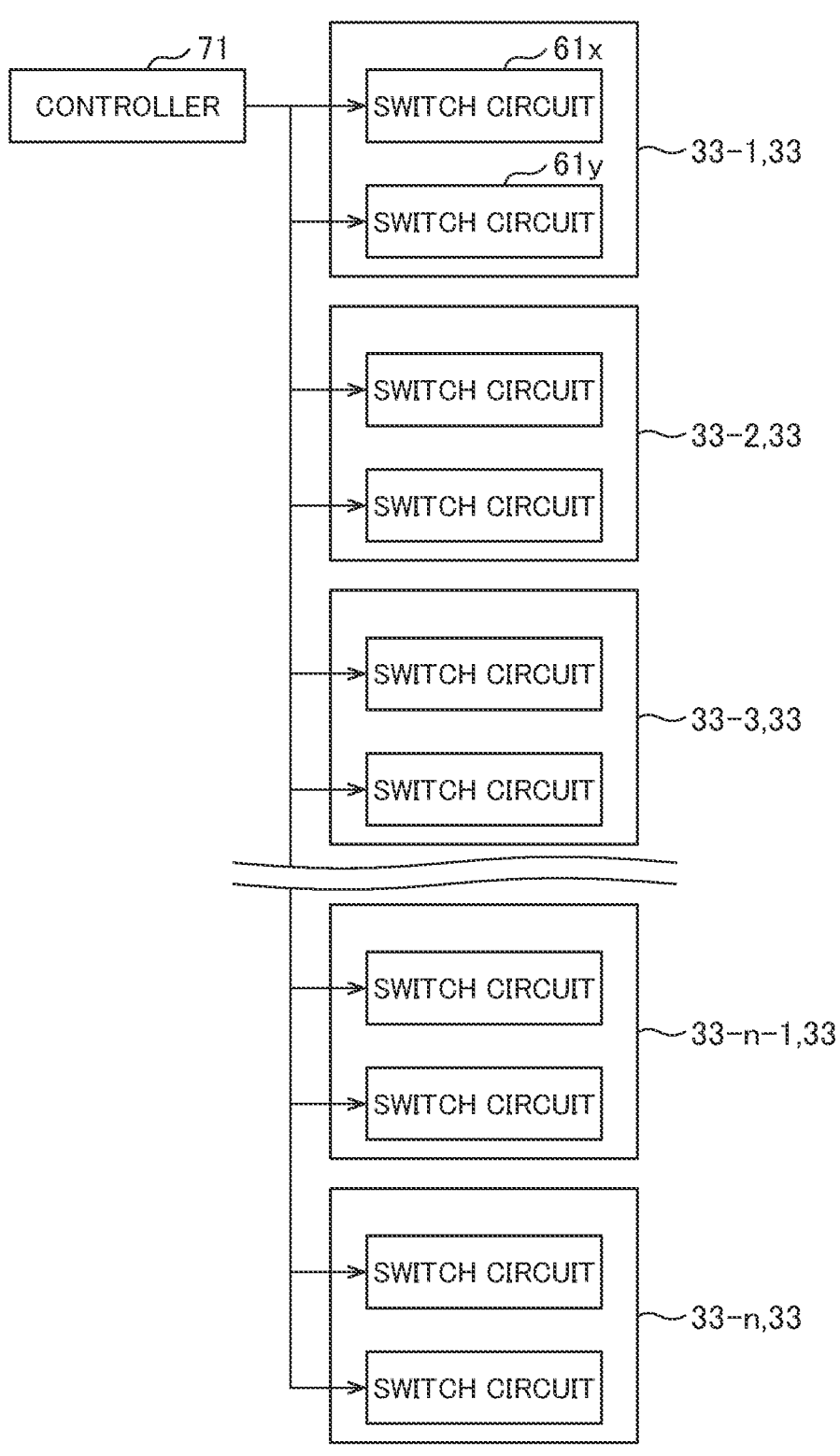
FIG. 4 is a block diagram of a controller and first to n-th transfer paths in an image sensor circuit in accordance with Embodiment 1.

FIG. 4 is a block diagram of a controller and the first to n-th transfer paths in an image sensor circuit in accordance with Embodiment 1.

Referring to FIG. 4, the image sensor circuit 13 includes a controller 71.

The controller 71 controls each transfer path 33 by controlling the switch circuit 61x and the switch circuit 61y for the transfer path 33.

Figure 5:
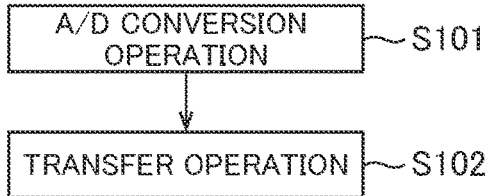
FIG. 5 is a flow chart representing the flow of a process implemented by the controller in the image sensor circuit in accordance with Embodiment 1.

FIG. 5 is a flow chart representing the flow of a process implemented by the controller in the image sensor circuit in accordance with Embodiment 1.

The controller 71 controls the first to n-th transfer paths 33-1, 33-2, 33-3, . . . , 33-*n*–1, and 33-*n* to cause each column A/D conversion circuit 26 to perform an A/D conversion operation and a transfer operation. The controller 71 causes each column A/D conversion circuit 26 to perform an A/D conversion operation and a transfer operation every time a row of p pixels 11 is selected. Referring to FIG. 5, the controller 71 causes each column A/D conversion circuit 26 to perform an A/D conversion operation in step S101 before causing each column A/D conversion circuit 26 to perform a transfer operation in step S102.

To cause each column A/D conversion circuit 26 to perform an A/D conversion operation, the controller 71 turns off the switch circuits 61x and the switch circuits 61y for the first to n-th transfer paths 33-1, 33-2, 33-3, . . . , 33-*n*–1, and 33-*n*. Hence, the controller 71 causes the first to n-th storage elements 32-1, 32-2, 32-3, . . . , 32-*n*–1, and 32-*n* to store the first to n-th pieces of bit data that constitute the A/D-converted data respectively in synchronism with the logic value outputted from the comparator 31 being inverted from the first logic value "1" to the second logic value "0."

To cause each column A/D conversion circuit 26 to perform a transfer operation, the controller 71 turns on the switch circuits 61x and the switch circuits 61y for some of the first to n-th transfer paths 33-1, 33-2, 33-3, . . . , 33-*n*–1, and 33-*n* and turns off the switch circuits 61x and the switch circuits 61y for the rest of the first to n-th transfer paths 33-1, 33-2, 33-3, . . . , 33-*n*–1, and 33-*n*. The controller 71 sequentially changes the switch circuit that is turned on, to prevent the first to n-th pieces of bit data from being damaged. Hence, the controller 71 causes each column A/D conversion circuit 26 to output the first to n-th pieces of bit data from the n-th storage element 32-*n*.

1.6 Comparing Reference Example and Embodiment 1

Figure 6:
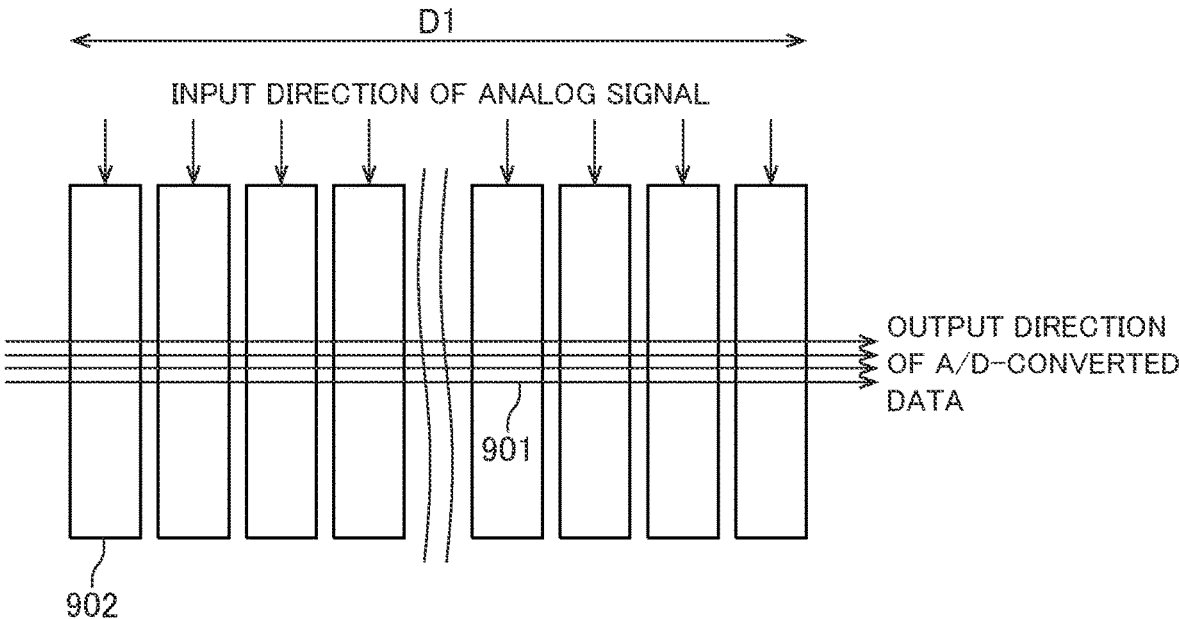
FIG. 6 is a diagram depicting an output direction of A/D-converted data in a CMOS image sensor in accordance with a reference example.
Figure 7:
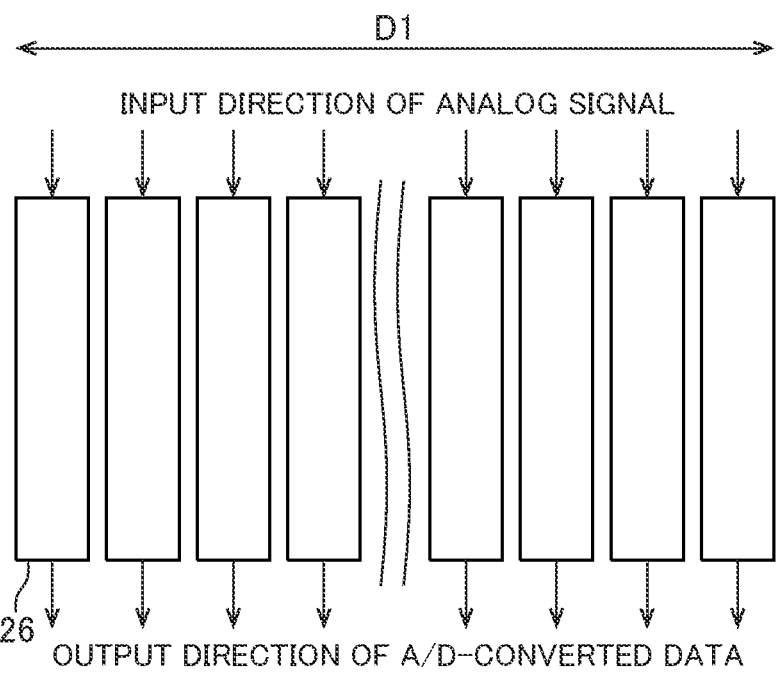
FIG. 7 is a diagram depicting an output direction of A/D-converted data in the CMOS image sensor in accordance with Embodiment 1.

FIG. 6 is a diagram depicting an output direction of A/D-converted data in a CMOS image sensor in accordance with a reference example. FIG. 7 is a diagram depicting an output direction of A/D-converted data in the CMOS image sensor in accordance with Embodiment 1.

Performance indices for a CMOS image sensor include a frame rate that indicates the number of pieces of image data that the CMOS image sensor can output per second. Recent demands have been for an increased throughput in outputting the A/D-converted data to a post-stage logic circuit, which will in turn lead to an increase in the frame rate of the CMOS image sensor. Therefore, suggestions have been made, for example, to allow circuits in the CMOS image sensor to operate parallelly and to enable the circuits to operate at high speed.

The CMOS image sensor includes a circuit called an H scan which includes H-direction scan buses that transfer the A/D-converted data to be outputted to the post-stage logic circuit in the horizontal direction which is parallel to the row direction D1. To enable the circuit to operate parallelly, the H-direction scan buses could be rendered parallel, in other words, rendered multiplex. To enable the circuit to operate at high speed, the frequency of a reference clock by means of which the H-direction scan operation is synchronized could be increased.

However, when the H-direction scan buses are rendered parallel, a large number of H-direction scan buses 901 are densely provided as shown in FIG. 6. In addition, the signals transferred by the H-direction scan buses 901 are densely provided on a side of a block of a plurality of column A/D conversion circuits 902. In addition, the H-direction scan buses 901 occupy a large area.

In addition, when the frequency of the reference clock by means of which the H-direction scan operation is synchronized is significantly increased, the circuit fails to operate normally. In addition, the frequency of the reference clock is a frequency that is suited for the throughput at which the A/D-converted data is outputted to the post-stage logic circuit. Therefore, when the frequency of the reference clock is increased, the frequency of the reference clock by means of which the reception operations of the post-stage logic circuit is synchronized should also be increased.

In contrast, in the CMOS image sensor 1 in accordance with Embodiment 1, the p column A/D conversion circuits 26 serve as a plurality of buses for outputting the A/D-converted data to the post-stage logic circuit 29 as shown in FIG. 7.

Hence, the buses for outputting the A/D-converted data to the post-stage logic circuit 29 can be rendered parallel, in other words, can be rendered multiplex. Hence, the operation of outputting the A/D-converted data to the post-stage logic circuit 29 can be sped up, which in turn enables an increase in the throughput at which the A/D-converted data is outputted to the post-stage logic circuit 29. Hence, the frame rate of the CMOS image sensor 1 can be increased.

In addition, the buses for outputting the A/D-converted data to the post-stage logic circuit 29 can be restrained from being densely provided. In addition, the signals transferred by the buses can be restrained from being densely provided on a side of a block of the p column A/D conversion circuits 26.

In addition, the wires for outputting the A/D-converted data can be decreased. Therefore, the wires occupy a smaller area.

Hence, the resultant image sensor circuit 13 operates at high speed and occupies only a small area.

In addition, the design of the timing at which the post-stage logic circuit 29 acquires the A/D-converted data is facilitated.

2 Embodiment 2

In the following, a description is given of differences of Embodiment 2 over Embodiment 1. The description may be silent about the structures and features of Embodiment 2 that are the same as those of Embodiment 1.

Figure 8:
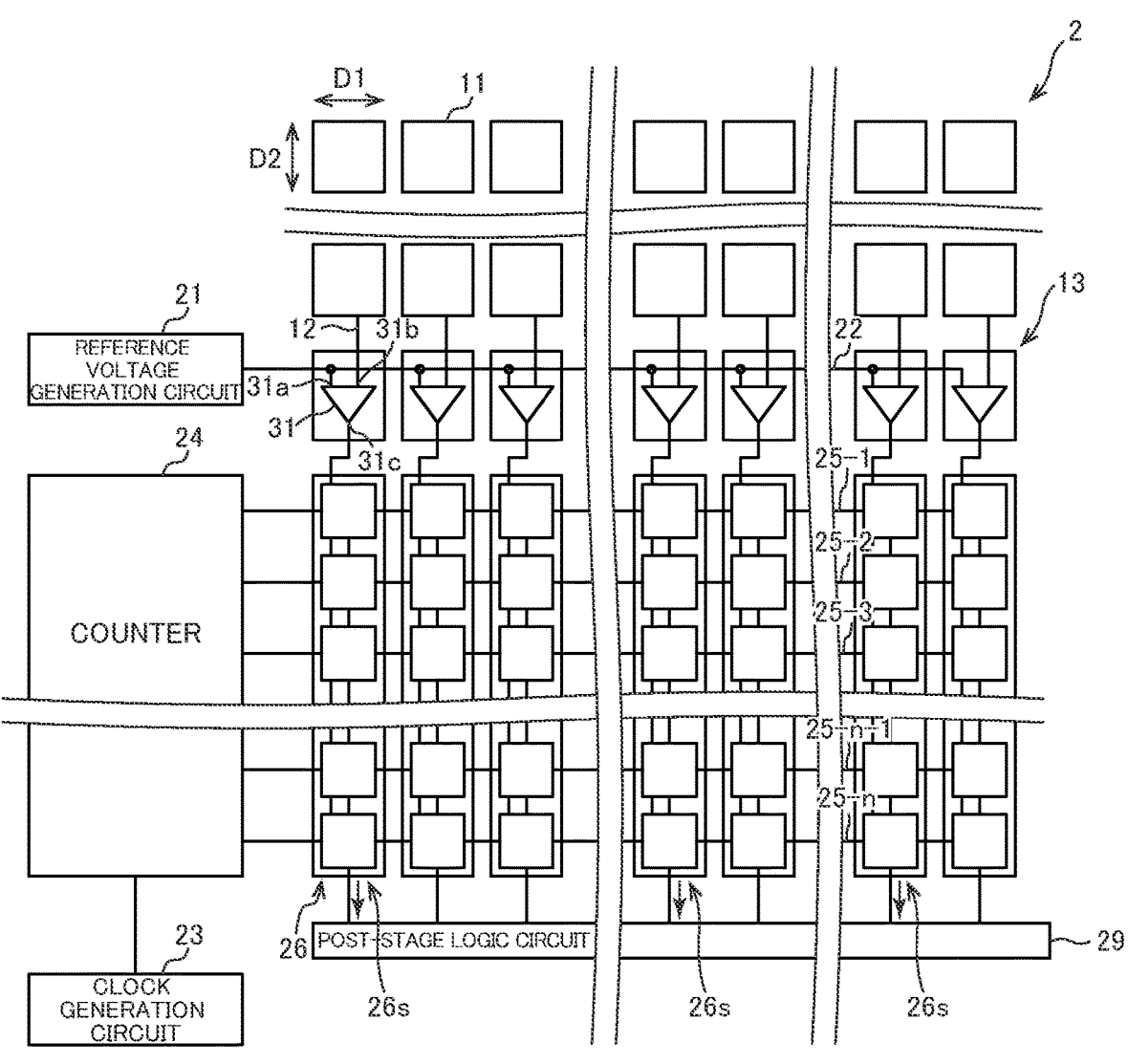
FIG. 8 is a block diagram of a CMOS image sensor in accordance with Embodiment 2.

FIG. 8 is a block diagram of a CMOS image sensor in accordance with Embodiment 2. FIG. 1B is an enlarged view of a part of FIG. 8.

Referring to FIG. 8, in a CMOS image sensor 2 in accordance with Embodiment 2, the controller 71 causes at least two column A/D conversion circuits 26s in the p column A/D conversion circuits 26 to simultaneously perform a transfer operation. This simultaneous activation of the at least two column A/D conversion circuits 26s enables at least two pieces of A/D-converted data respectively stored in the at least two column A/D conversion circuits 26s to be outputted simultaneously to the post-stage logic circuit 29. Hence, the operation of outputting the A/D-converted data to the post-stage logic circuit 29 can be sped up, which in turn enables an increase in the throughput at which the A/D-converted data is outputted to the post-stage logic circuit 29. At least two pieces of A/D-converted data may be outputted to the post-stage logic circuit 29 via the MUX circuits 27 shown in FIG. 1A.

3 Embodiment 3

In the following, a description is given of differences of Embodiment 3 over Embodiment 1. The description may be silent about the structures and features of Embodiment 3 that are the same as those of Embodiment 1.

Figure 9:
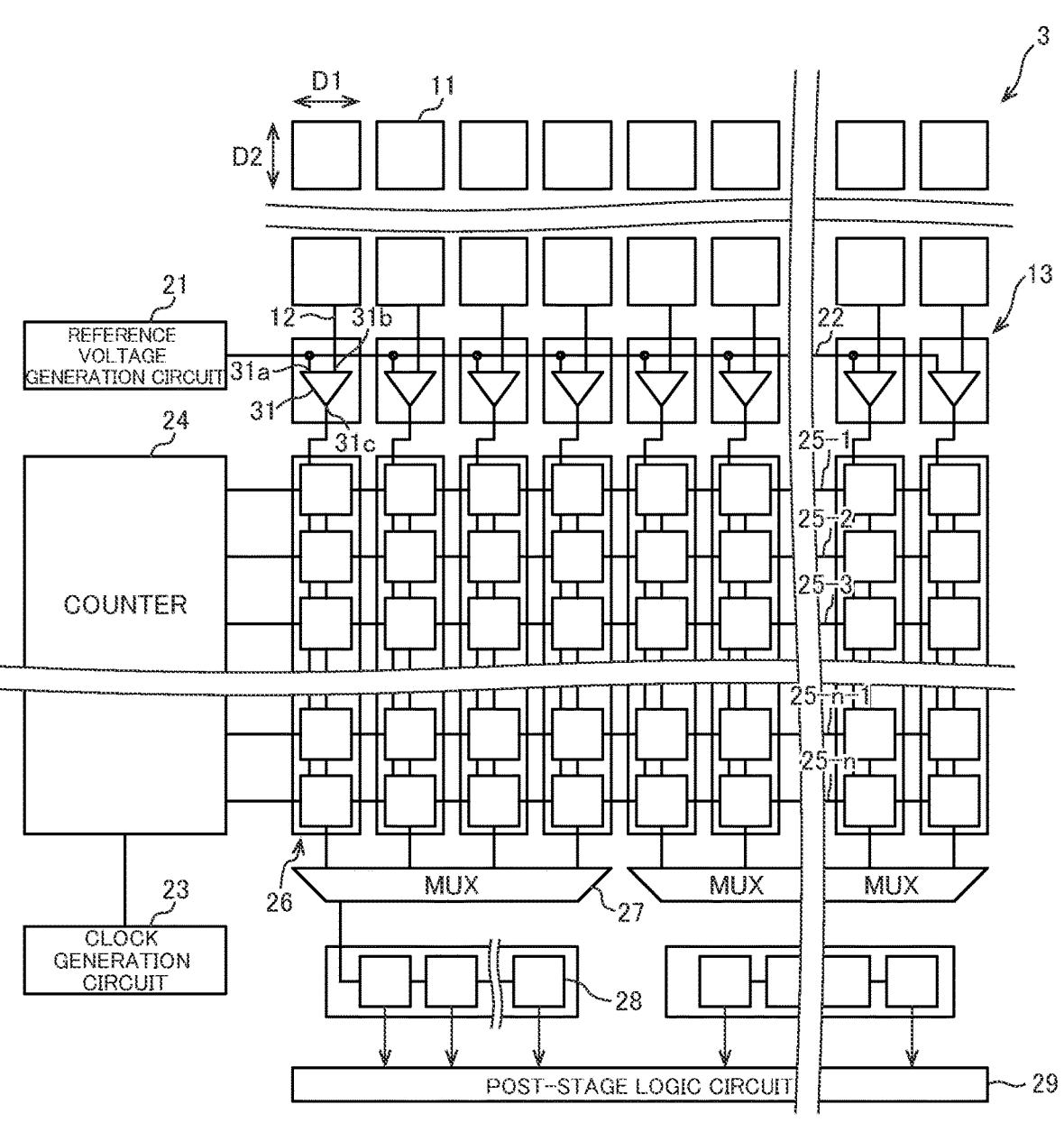
FIG. 9 is a block diagram of a CMOS image sensor in accordance with Embodiment 3.

FIG. 9 is a block diagram of a CMOS image sensor in accordance with Embodiment 3. FIG. 1B is an enlarged view of a part of FIG. 9.

Referring to FIG. 9, in a CMOS image sensor 3 in accordance with Embodiment 3, the image sensor circuit 13 includes a plurality of shift register circuits 28.

The plurality of MUX circuits 27 serially output the first to n-th pieces of bit data and serially input the serially outputted, first to n-th pieces of bit data to the plurality of shift register circuits 28 respectively. Hence, the at least two column A/D conversion circuits 26 can share a single shift register circuit 28. Hence, the plurality of shift register circuits 28 occupy a smaller area. The plurality of MUX circuits 27 are structured in such a manner that the output rate of the A/D-converted data from the column A/D conversion circuits 26 is not low.

Each shift register circuit 28 in the plurality of shift register circuits 28 stores the serially inputted, first to n-th pieces of bit data and parallelly outputs the stored, first to n-th pieces of bit data. Hence, each shift register circuit 28 converts the serial data containing the serially inputted, first to n-th pieces of bit data to parallel data containing the parallelly outputted, first to n-th pieces of bit data. The post-stage logic circuit 29 processes the parallelly inputted, first to n-th pieces of bit data.

In the CMOS image sensor 1 in accordance with Embodiment 1, the first to n-th pieces of bit data that are obtained by A/D-converting the analog signals outputted from one of the pixels 11 and that constitute the A/D-converted data are sequentially outputted to the post-stage logic circuit 29.

In contrast, in the CMOS image sensor 3 in accordance with Embodiment 3, these first to n-th pieces of bit data are collectively outputted at the same timing to the post-stage logic circuit 29. Hence, the post-stage logic circuit 29 can make the data processing unit the data for one pixel 11. Hence, the post-stage logic circuit 29 can process the data for one pixel 11 together.

Figure 10:
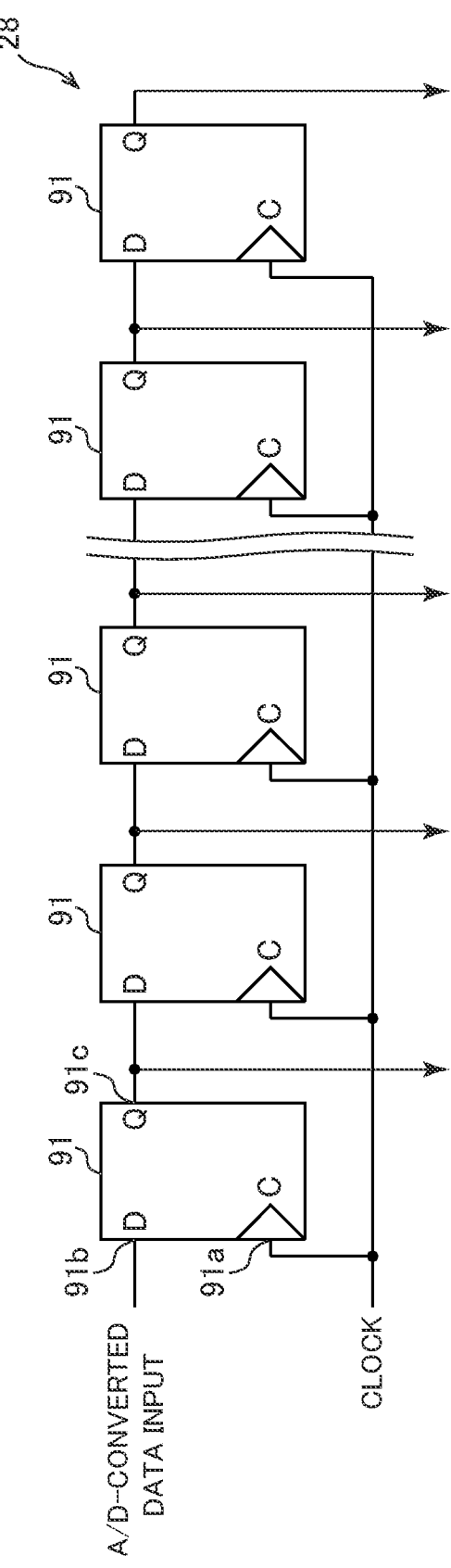
FIG. 10 is a circuit diagram of a first example of each shift register circuit in the CMOS image sensor in accordance with Embodiment 3.

FIG. 10 is a circuit diagram of a first example of each shift register circuit in the CMOS image sensor in accordance with Embodiment 3.

Referring to FIG. 10, in the first example, the shift register circuit 28 includes n D-type flip-flops 91. Each D-type flip-flop 91 in the n D-type flip-flops 91 has a clock input terminal 91a, a D-input terminal 91b, and a Q-output terminal 91c.

Each D-type flip-flop 91 retains the bit data inputted to the D-input terminal 91b on a rise of the clock pulse inputted to the clock input terminal 91a, to output the retained bit data through the Q-output terminal 91c.

The clock input terminals 91a of the n D-type flip-flops 91 are electrically connected to a clock generation circuit.

Hence, the clock input terminals 91a of the n D-type flip-flops 91 are fed with a common clock generated by the clock generation circuit. The D-input terminal 91b of the D-type flip-flop 91 in the first stage is electrically connected to the MUX circuit 27. Hence, the D-input terminals 91b of the D-type flip-flops 91 in the first stages are serially fed with the first to n-th pieces of bit data that constitute the A/D-converted data outputted by the MUX circuits 27. The n D-type flip-flops 91 are electrically connected in series. Therefore, the D-input terminals 91b of the n–1 D-type flip-flops 91 other than the D-type flip-flop 91 in the first stage are electrically connected respectively to the Q-output terminals 91c of the n–1 D-type flip-flops 91 in the immediately preceding stage respectively. Hence, the D-input terminals 91b of the n–1 D-type flip-flops 91 other than the D-type flip-flop 91 in the first stage are fed with the bit data outputted through the Q-output terminals 91c of the n–1 D-type flip-flops 91 in the immediately preceding stage respectively. The Q-output terminals 91c of the n D-type flip-flops 91 are electrically connected to the post-stage logic circuit 29. Hence, the bit data retained by the n D-type flip-flops 91 is outputted respectively through the Q-output terminals 91c of the n D-type flip-flops 91. In addition, the outputted bit data is inputted to the post-stage logic circuit 29.

Hence, the shift register circuits 28 performs the shift operation of causing the bit data retained by the n–1 D-type flip-flops 91 other than the D-type flip-flop 91 in the last stage to be retained respectively by the n–1 D-type flip-flops 91 in the immediately succeeding stages on every rise of the clock pulse. In addition, the shift register circuits 28 transfer the inputted bit data from the D-type flip-flop 91 in the first stage toward the D-type flip-flop 91 in the last stage, by performing the shift operation every time one piece of bit data contained in the first to n-th pieces of bit data is inputted. After the first to n-th pieces of bit data are fed to the shift register circuits 28, and the n D-type flip-flops 91 retain the first to n-th pieces of bit data, the clock input to the clock input terminals 91a of the n D-type flip-flops 91 is stopped. While the clock input is being stopped, the n D-type flip-flops 91 parallelly output the retained, first to n-th pieces of bit data and parallelly inputs the parallelly outputted, first to n-th pieces of bit data to the post-stage logic circuit 29.

Figure 11:
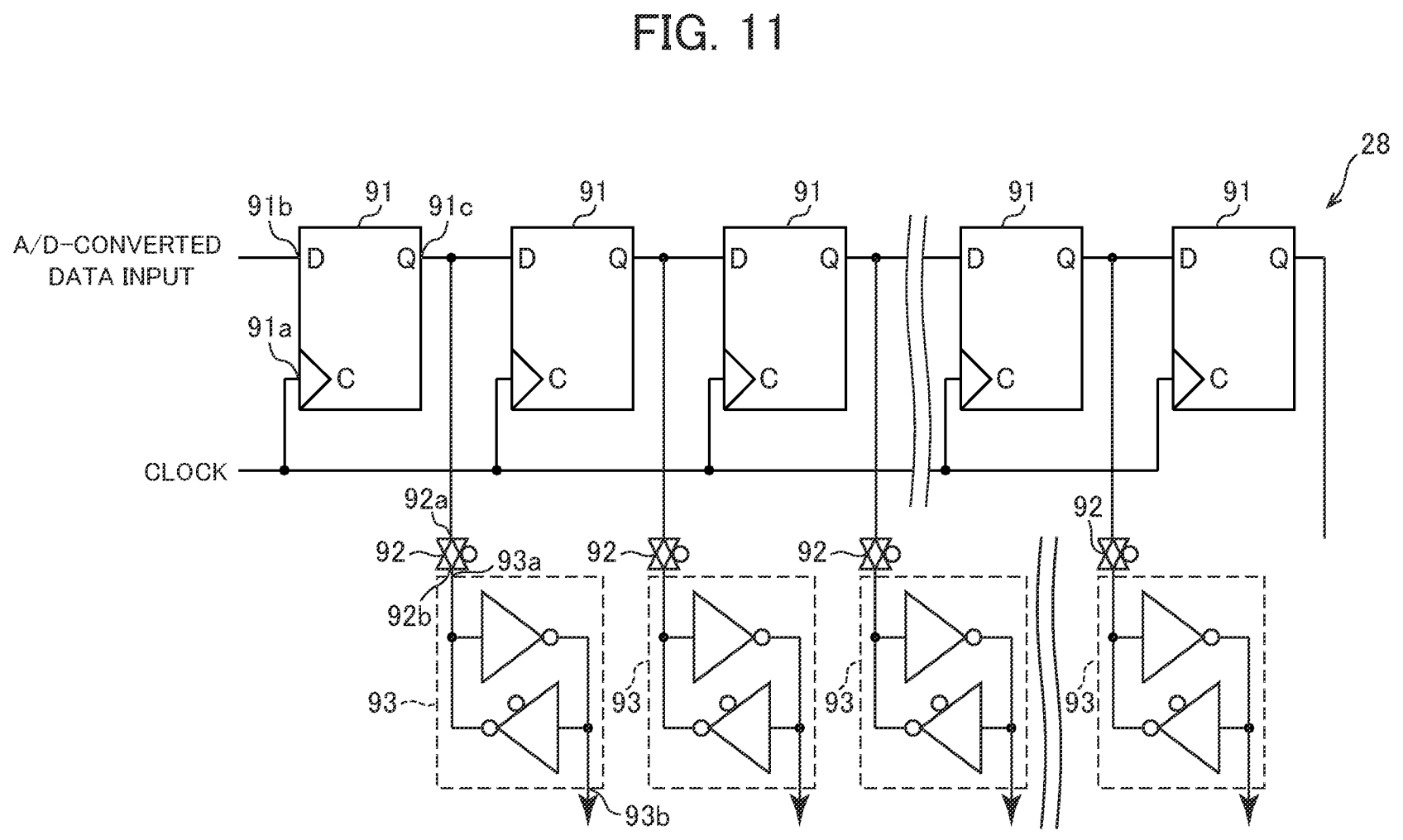

FIG. 11 is a circuit diagram of a second example of each shift register circuit in the CMOS image sensor in accordance with Embodiment 3.

Referring to FIG. 11, in the second example, the shift register circuit 28 includes the n D-type flip-flops 91, n switches 92, and n latch circuits 93. Each switch 92 in the n switches 92 has a first terminal 92a and a second terminal 92b. Each latch circuit 93 in the n latch circuits 93 has an input terminal 93a and an output terminal 93b.

The n D-type flip-flops 91 in the second example are D-type flip-flops that are similar to the n D-type flip-flops 91 in the first example.

Each switch 92 assumes a state selected from an ON state in which the second terminal 92b is electrically connected to the first terminal 92a and an OFF state in which the second terminal 92b is electrically disconnected from the first terminal 92a.

The first terminals 92a of the n switches 92 are electrically connected respectively to the Q-output terminals 91c of the n D-type flip-flops 91. The second terminals 92b of the n switches 92 are electrically connected respectively to the input terminals 93a of the n latch circuits 93.

Hence, the n switches 92 assume a state selected from an ON state in which the input terminals 93a of the n latch circuits 93 are electrically connected to the Q-output terminals 91c of the n D-type flip-flops 91 and an OFF state in which the input terminals 93a of the n latch circuits 93 are electrically disconnected from the Q-output terminals 91c of the n D-type flip-flops 91.

Each latch circuit 93 retains the bit data inputted through the input terminal 93a and outputs the retained bit data through the output terminal 93b.

The input terminals 93a of the n latch circuits 93 are electrically connected respectively to the second terminals 92b of the n switches 92 and also respectively to the Q-output terminals 91c of the n D-type flip-flops 91 via the n switches 92. The output terminal 93b of the n latch circuits 93 are electrically connected to the post-stage logic circuit 29.

Hence, the n latch circuits 93, while the n switches 92 are in the OFF state, retain the bit data being inputted through the input terminal 93a when the n switches 92 are turned OFF, to output the retained bit data through the output terminal 93b for input to the post-stage logic circuit 29.

The controller 71 turns on the n switches 92 after the n D-type flip-flops 91 retain the first to n-th pieces of bit data respectively. Hence, the first to n-th pieces of bit data outputted from the Q-output terminals 91c of the n D-type flip-flops 91 are inputted respectively to the input terminals 93a of the n latch circuits 93. In other words, the first to n-th pieces of bit data are respectively transferred from the Q-output terminals 91c of the n D-type flip-flops 91 to the input terminals 93a of then latch circuits 93.

The controller 71 turns off the n switches 92 after the first to n-th pieces of bit data are transferred. Hence, the n latch circuits 93 retain the transferred, first to n-th pieces of bit data, to parallelly output the retained, first to n-th pieces of bit data for input to the post-stage logic circuit 29.

Hence, the design of the setup of acquisition of the A/D-converted data by the post-stage logic circuit 29 and the timing at which the post-stage logic circuit 29 holds the A/D-converted data is facilitated.

4 Embodiment 4

In the following, a description is given of differences of Embodiment 4 over Embodiment 3. The description may be silent about the structures and features of Embodiment 4 that are the same as those of Embodiment 3.

Figure 12A:
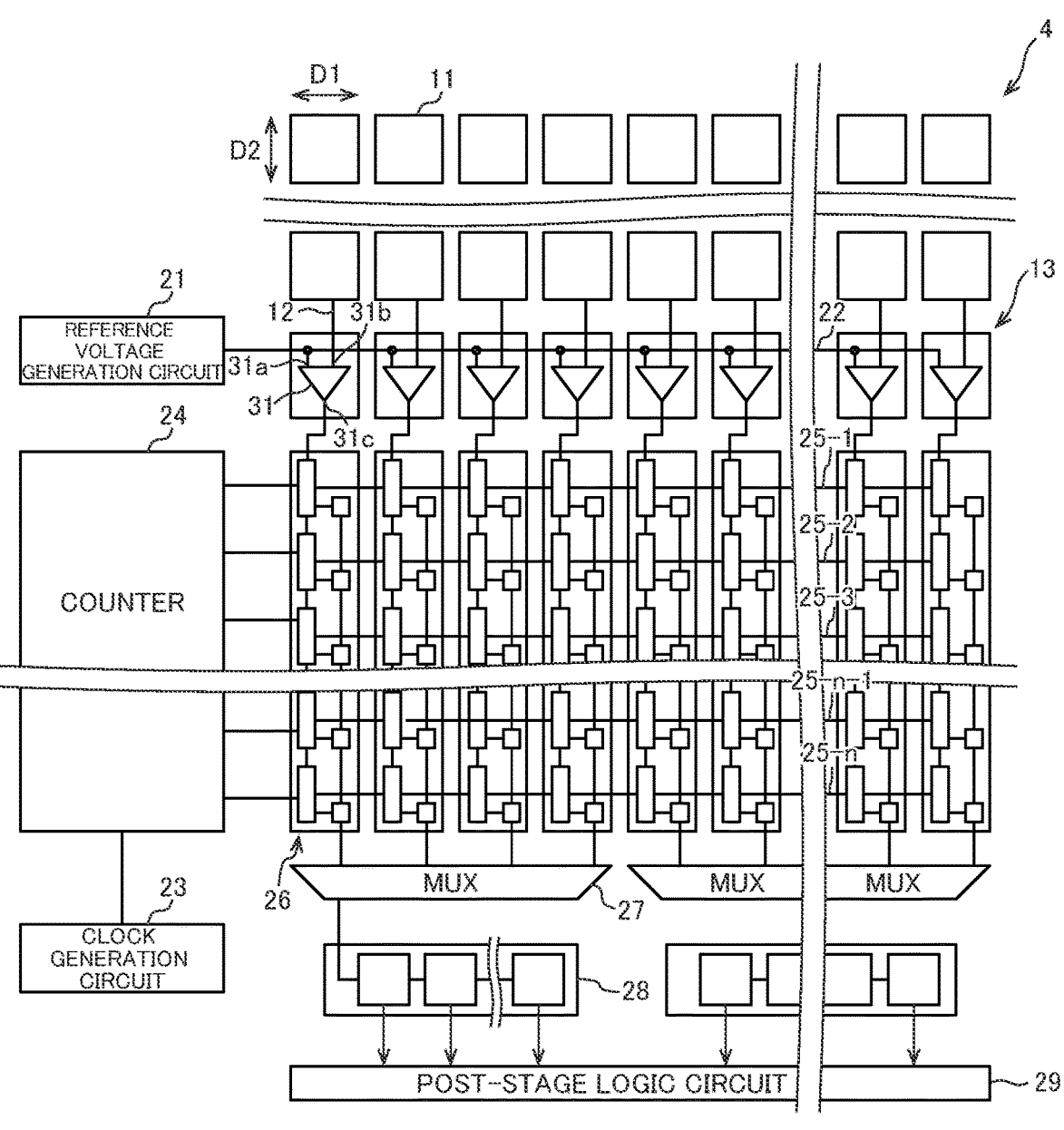
FIG. 12A is a block diagram of a CMOS image sensor in accordance with Embodiment 4.
Figure 12B:
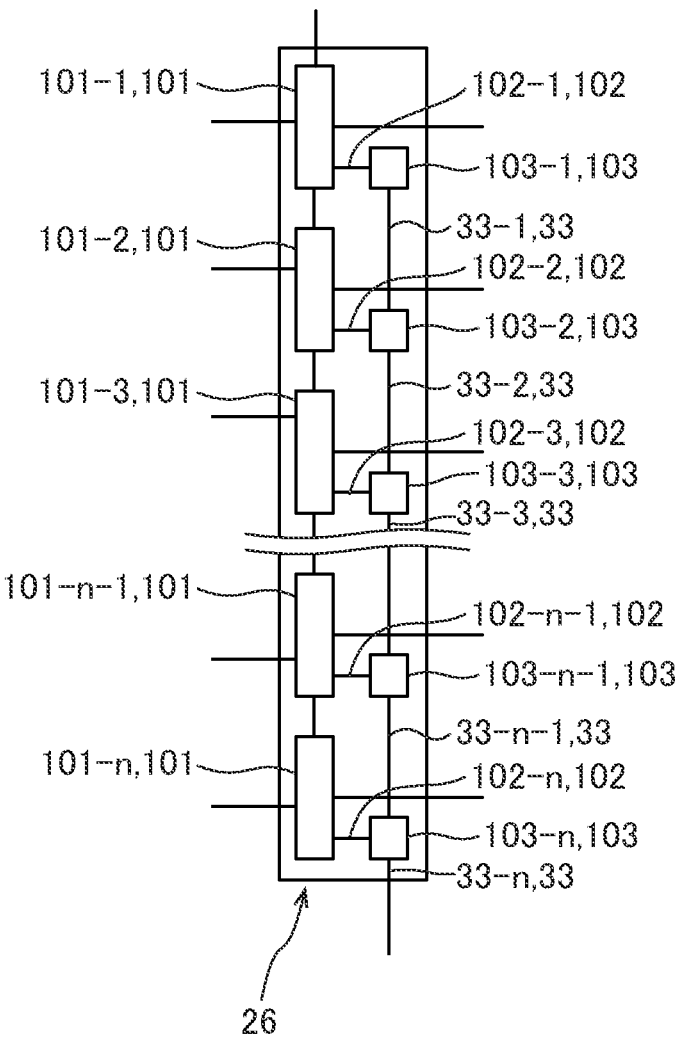
FIG. 12B is an enlarged view of a part of FIG. 12A.
Figure 13:
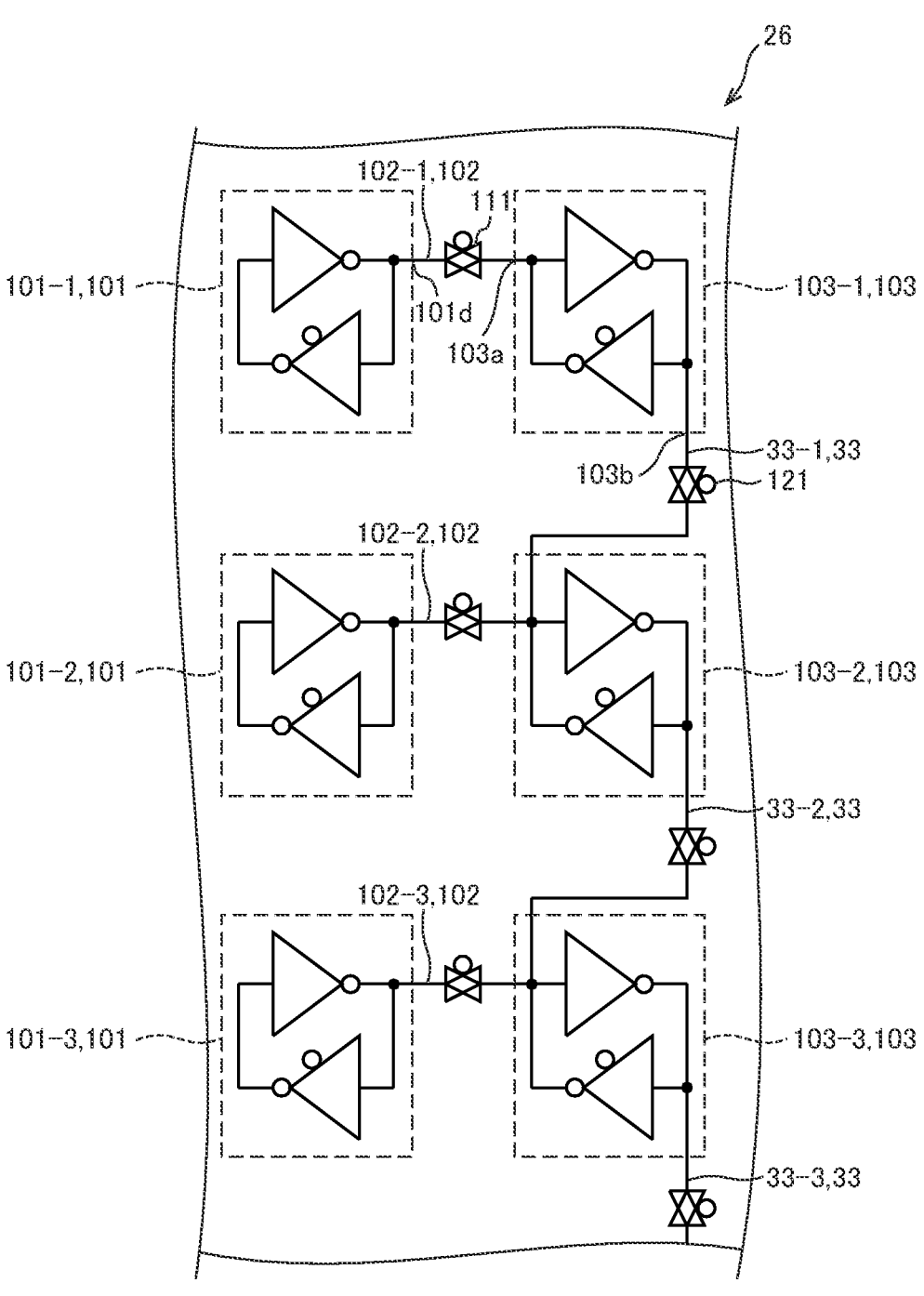
FIG. 13 is a circuit diagram of each column A/D conversion circuit in the CMOS image sensor in accordance with Embodiment 4.

FIG. 12A is a block diagram of a CMOS image sensor in accordance with Embodiment 4. FIG. 12B is an enlarged view of a part of FIG. 12A. FIG. 13 is a circuit diagram of each column A/D conversion circuit in the CMOS image sensor in accordance with Embodiment 4.

Referring to FIGS. 12A, 12B, and 13, in a CMOS image sensor 4 in accordance with Embodiment 4, each column A/D conversion circuit 26 includes first to n-th transfer source storage elements 101-1, 101-2, 101-3, . . . , 101-n–1, and 101-n, first to n-th bit data transfer paths 102-1, 102-2, 102-3, . . . , 102-n–1, and 102-n, and first to n-th transfer destination storage elements 103-1, 103-2, 103-3, . . . , 103-n–1, and 103-n. Each transfer source storage element 101 in the first to n-th transfer source storage elements 101-1, 101-2, 101-3, . . . , 101-n–1, and 101-n has an output terminal 101d. Each transfer destination storage element 103 in the first to n-th transfer destination storage elements 103-1, 103-2, 103-3, . . . , 103-n–1, and 103-n has an input terminal 103a and an output terminal 103b.

The first to n-th transfer source storage elements 101-1, 101-2, 101-3, . . . , 101-n–1, and 101-n in the CMOS image sensor 4 in accordance with Embodiment 4 respectively store the first to n-th pieces of bit data that constitute the A/D-converted data similarly to the first to n-th storage elements 32-1, 32-2, 32-3, . . . , 32-n–1, and 32-n in the CMOS image sensor 1 in accordance with Embodiment 1.

Each bit data transfer path 102 in the first to n-th bit data transfer paths 102-1, 102-2, 102-3, . . . , 102-n–1, and 102-n transfers bit data from an end of the bit data transfer path 102 to the other end of the bit data transfer path 102.

Ends of the first to n-th bit data transfer paths 102-1, 102-2, 102-3, . . . , 102-n–1, and 102-n are electrically connected respectively to the output terminals 101d of the first to n-th transfer source storage elements 101-1, 101-2, 101-3, . . . , 101-n–1, and 101-n. The other ends of the first to n-th bit data transfer paths 102-1, 102-2, 102-3, . . . , 102-n–1, and 102-n are electrically connected respectively to the input terminals 103a of the first to n-th transfer destination storage elements 103-1, 103-2, 103-3, . . . , 103-n–1, and 103-n.

Hence, the first to n-th bit data transfer paths 102-1, 102-2, 102-3, . . . , 102-n–1, and 102-n electrically connect the input terminals 103a of the first to n-th transfer destination storage elements 103-1, 103-2, 103-3, . . . , 103-n–1, and 103-n to the output terminals 101d of the first to n-th transfer source storage elements 101-1, 101-2, 101-3, . . . , 101-n–1, and 101-n respectively. Hence, the first to n-th bit data transfer paths 102-1, 102-2, 102-3, . . . , 102-n–1, and 102-n respectively transfer the first to n-th pieces of bit data stored in the first to n-th transfer source storage elements 101-1, 101-2, 101-3, . . . , 101-n–1, and 101-n from the first to n-th transfer source storage elements 101-1, 101-2, 101-3, . . . , 101-n–1, and 101-n to the first to n-th transfer destination storage elements 103-1, 103-2, 103-3, . . . , 103-n–1, and 103-n.

Each transfer destination storage element 103 retains the bit data inputted through the input terminal 103a to output the retained bit data through the output terminal 103b.

The input terminals 103a of the first to n-th transfer destination storage elements 103-1, 103-2, 103-3, . . . , 103-n–1, and 103-n are electrically connected respectively to the other ends of the first to n-th bit data transfer paths 102-1, 102-2, 102-3, . . . , 102-n–1, and 102-n.

Hence, the first to n-th transfer destination storage elements 103-1, 103-2, 103-3, . . . , 103-n–1, and 103-n respectively stores the first to n-th pieces of bit data transferred by the first to n-th bit data transfer paths 102-1, 102-2, 102-3, . . . , 102-n–1, and 102-n.

Each transfer path 33 transfers bit data from an end of the transfer path 33 to the other end of the transfer path 33.

Ends of the first to (n–1)-th transfer paths 33-1, 33-2, 33-3, . . . , and 33-n–1 are electrically connected respectively to the output terminals 103b of the first to (n–1)-th transfer destination storage elements 103-1, 103-2, 103-3, . . . , and 103-n–1. The other ends of the first to (n–1)-th transfer paths 33-1, 33-2, 33-3, . . . , and 33-n–1 are electrically connected respectively to the input terminals 103a of the second to n-th transfer destination storage elements 103-2, 103-3, . . . , 103-n–1, and 103-n.

Hence, the first to (n–1)-th transfer paths 33-1, 33-2, 33-3, . . . , and 33-n–1 respectively electrically connect the input terminals 103a of the second to n-th transfer destination storage elements 103-2, 103-3, . . . , 103-n–1, and 103-n to the output terminals 103b of the adjacent first to (n–1)-th transfer destination storage elements 103-1, 103-2, 103-3, . . . , 103-n–1, and 103-n. Hence, the first to (n–1)-th transfer paths 33-1, 33-2, 33-3, . . . , and 33-n–1 respectively transfer the bit data stored in the first to (n–1)-th transfer destination storage elements 103-1, 103-2, 103-3, . . . , 103-$n$–1, and 103-$n$ from the first to (n–1)-th transfer destination storage elements 103-1, 103-2, 103-3, . . . , and 103-$n$–1 to the second to n-th transfer destination storage elements 103-2, 103-3, . . . , 103-$n$–1, and 103-$n$.

The n-th transfer path 33-$n$ transfers bit data from an end of the n-th transfer path 33-$n$ to the other end of the n-th transfer path 33-$n$.

An end of the n-th transfer path 33-$n$ is electrically connected to the output terminal 103$b$ of the n-th transfer destination storage element 103-$n$. The other end of the n-th transfer path 33-$n$ is electrically connected to the MUX circuit 27.

Hence, the n-th transfer path 33-$n$ electrically connects the MUX circuit 27 to the output terminal 103$b$ of the n-th transfer destination storage element 103-$n$. Hence, the n-th transfer path 33-$n$ transfers the bit data stored in the n-th transfer destination storage element 103-$n$ from the n-th transfer destination storage element 103-$n$ to the MUX circuit 27 outside each column A/D conversion circuit 26.

Referring to FIG. 13, each bit data transfer path 102 has a switch circuit 111.

The switch circuit 111 assumes a state selected from an ON state in which the other end of each bit data transfer path 102 is electrically connected to the end of the bit data transfer path 102 and an OFF state in which the other end of the bit data transfer path 102 is electrically disconnected from the end of the bit data transfer path 102.

Hence, the switch circuits 111 on the first to (n–1)-th bit data transfer paths 102-1, 102-2, 102-3, . . . , and 102-$n$–1 assumes a state selected from an ON state in which the input terminals 103$a$ of the first to n-th transfer destination storage elements 103-1, 103-2, 103-3, . . . , 103-$n$–1, and 103-$n$ are electrically connected to the output terminals 101$d$ of the first to n-th transfer source storage elements 101-1, 101-2, 101-3, . . . , 101-$n$–1, and 101-$n$ and an OFF state in which the input terminals 103$a$ of the first to n-th transfer destination storage elements 103-1, 103-2, 103-3, . . . , 103-$n$–1, and 103-$n$ are electrically disconnected from the output terminals 101$d$ of the first to n-th transfer source storage elements 101-1, 101-2, 101-3, . . . , 101-$n$–1, and 101-$n$.

The controller 71 controls each bit data transfer path 102 by controlling the switch circuit 111.

Figure 14:
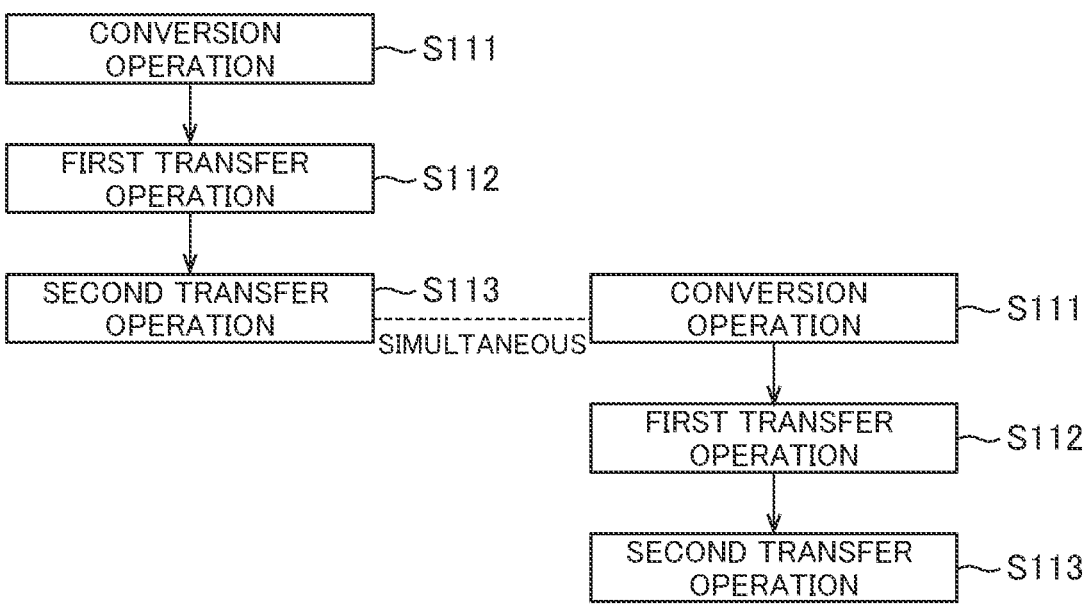
FIG. 14 is a flow chart representing the flow of a process implemented by a controller in an image sensor in accordance with Embodiment 4.

FIG. 14 is a flow chart representing the flow of a process implemented by a controller in an image sensor in accordance with Embodiment 4.

The controller 71 controls the first to n-th transfer paths 33-1, 33-2, 33-3, . . . , 33-$n$–1, and 33-$n$ and the first to n-th bit data transfer paths 102-1, 102-2, 102-3, . . . , 102-$n$–1, and 102-$n$ so that each column A/D conversion circuit 26 performs an A/D conversion operation, a first transfer operation, and a second transfer operation. Every time a row of p pixels 11 is selected, the controller 71 causes each column A/D conversion circuit 26 to perform an A/D conversion operation, a first transfer operation, and a second transfer operation. Referring to FIG. 14, after causing each column A/D conversion circuit 26 to perform an A/D conversion operation in step S111, the controller 71 causes each column A/D conversion circuit 26 to perform the first transfer operation in step S112. In addition, after causing each column A/D conversion circuit 26 to perform the first transfer operation in step S112, the controller 71 causes each column A/D conversion circuit 26 to perform the second transfer operation in step S113. Simultaneously with causing each column A/D conversion circuit 26 to perform the second transfer operation, the controller 71 causes each column A/D conversion circuit 26 to perform an A/D conversion operation on a subsequently selected row.

To cause each column A/D conversion circuit 26 to perform an A/D conversion operation, the controller 71 turns OFF the switch circuits 111 on the first to n-th bit data transfer paths 102-1, 102-2, 102-3, . . . , 102-$n$–1, and 102-$n$. Hence, the controller 71 causes the first to n-th transfer source storage elements 101-1, 101-2, 101-3, . . . , 101-$n$–1, and 101-$n$ to respectively store the first to n-th pieces of bit data that constitute the A/D-converted data in synchronism with the logic value outputted by the comparator 31 being inverted from the first logic value "1" to the second logic value "0."

To each column A/D conversion circuit 26 to perform the first transfer operation, the controller 71 turns ON the switch circuits 111 on the first to n-th bit data transfer paths 102-1, 102-2, 102-3, . . . , 102-$n$–1, and 102-$n$. Hence, the controller 71 causes the first to n-th bit data transfer paths 102-1, 102-2, 102-3, . . . , 102-$n$–1, and 102-$n$ to respectively transfer the first to n-th pieces of bit data stored in the first to n-th transfer source storage elements 101-1, 101-2, 101-3, . . . , 101-$n$–1, and 101-$n$ from the first to n-th transfer source storage elements 101-1, 101-2, 101-3, . . . , 101-$n$–1, and 101-$n$ to the first to n-th transfer destination storage elements 103-1, 103-2, 103-3, . . . , 103-$n$–1, and 103-$n$.

To cause each column A/D conversion circuit 26 to perform the second transfer operation, the controller 71 turns OFF the switch circuits 111 on the first to n-th bit data transfer paths 102-1, 102-2, 102-3, . . . , 102-$n$–1, and 102-$n$, turns ON some switch circuits 121 on the first to n-th transfer paths 33-1, 33-2, 33-3, . . . , 33-$n$–1, and 33-$n$, and turns OFF the remaining switch circuits 121 on the first to n-th transfer paths 33-1, 33-2, 33-3, . . . , 33-$n$–1, and 33-$n$. The controller 71 sequentially changes the switch circuit 121 that is to be turned ON, to prevent the first to n-th pieces of bit data from being damaged. Hence, the controller 71 causes each column A/D conversion circuit 26 to output the first to n-th pieces of bit data from the n-th transfer destination storage element 103-$n$.

In the CMOS image sensor 1 in accordance with Embodiment 1, there is provided one storage element constituted by the storage element 32, to store each piece of bit data contained in the first to n-th pieces of bit data. In addition, the first to n-th storage elements 32-1, 32-2, 32-3, . . . , 32-$n$–1, and 32-$n$ that store the A/D-converted data for the first time are electrically connected to each other, forming a path for outputting the A/D-converted data to the post-stage logic circuit 29.

In contrast, in the CMOS image sensor 4 in accordance with Embodiment 4, there are provided two storage elements constituted by the transfer source storage element 101 and the transfer destination storage element 103, to store each piece of bit data contained in the first to n-th pieces of bit data. In addition, the first to n-th transfer source storage elements 101-1, 101-2, 101-3, . . . , 101-$n$–1, and 101-$n$ that store the A/D-converted data for the first time are not electrically connected to each other, forming no path for outputting the A/D-converted data to the post-stage logic circuit 29. Instead, the A/D-converted data is transferred from the first to n-th transfer source storage elements 101-1, 101-2, 101-3, . . . , 101-$n$–1, and 101-$n$ to the first to n-th transfer destination storage elements 103-1, 103-2, 103-3, . . . , 103-$n$–1, and 103-$n$. In addition, the first to n-th transfer destination storage elements 103-1, 103-2, 103-3, . . . , 103-$n$–1, and 103-$n$ are electrically connected to each other, forming a path for outputting the A/D-converted data to the post-stage logic circuit 29. Hence, it becomes possible to cause each column A/D conversion circuit 26 to simultaneously perform the second transfer operation and perform the A/D conversion operation on a subsequently selected row. Hence, a pipe line operation becomes possible. Hence, the frame rate of the CMOS image sensor 4 can be increased.

5 Embodiment 5

In the following, a description is given of differences of Embodiment 5 over Embodiment 2. The description may be silent about the structures and features of Embodiment 5 that are the same as those of Embodiment 2.

Figure 15A:
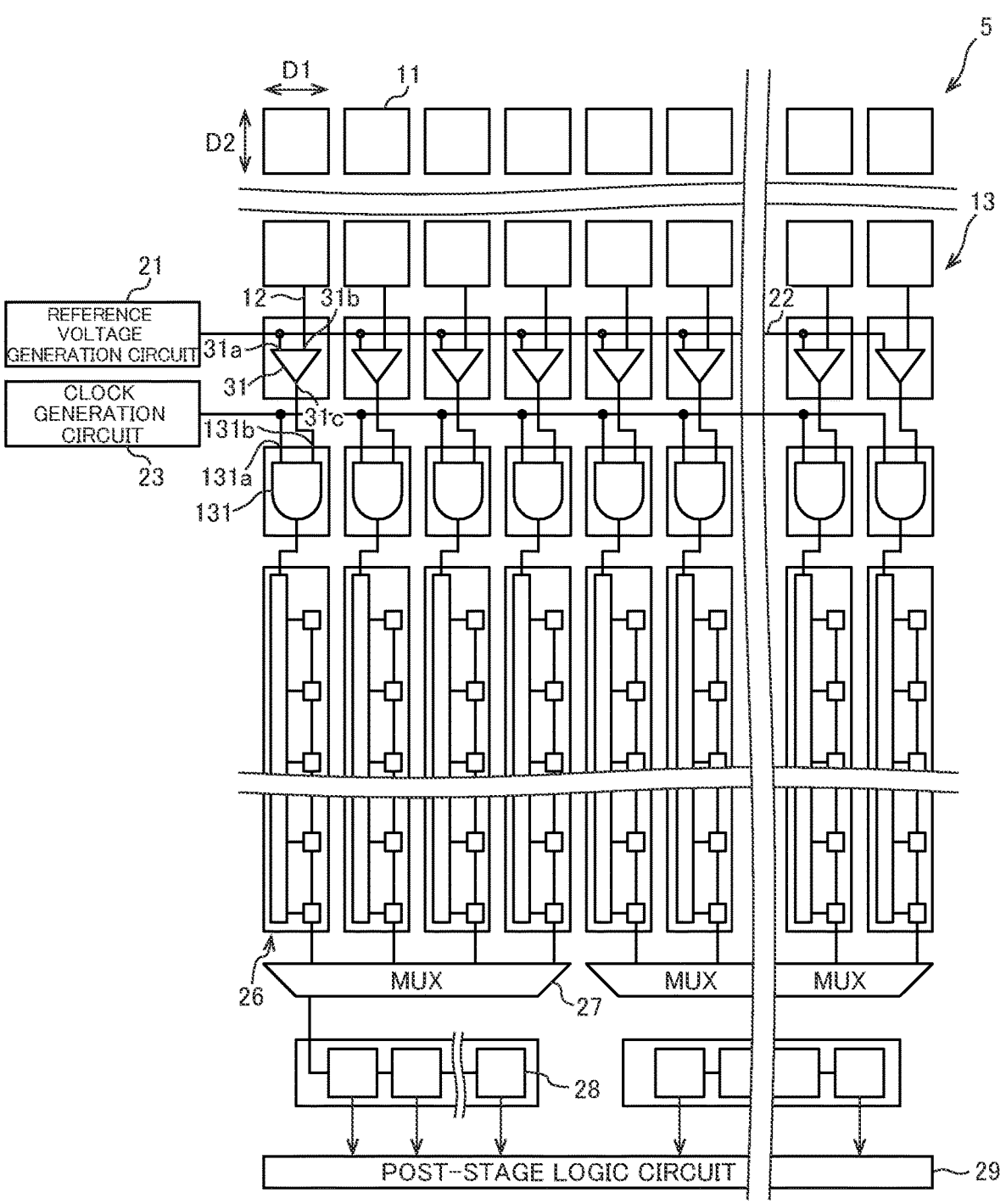
FIG. 15A is a block diagram of a CMOS image sensor in accordance with Embodiment 5.
Figure 15B:
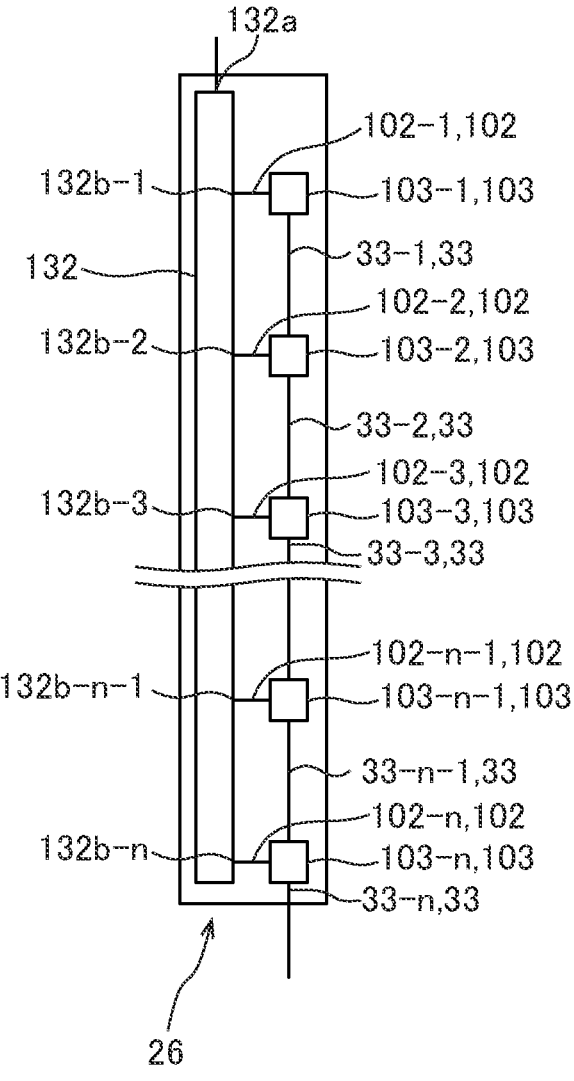
FIG. 15B is an enlarged view of a part of FIG. 15A.
Figure 16:
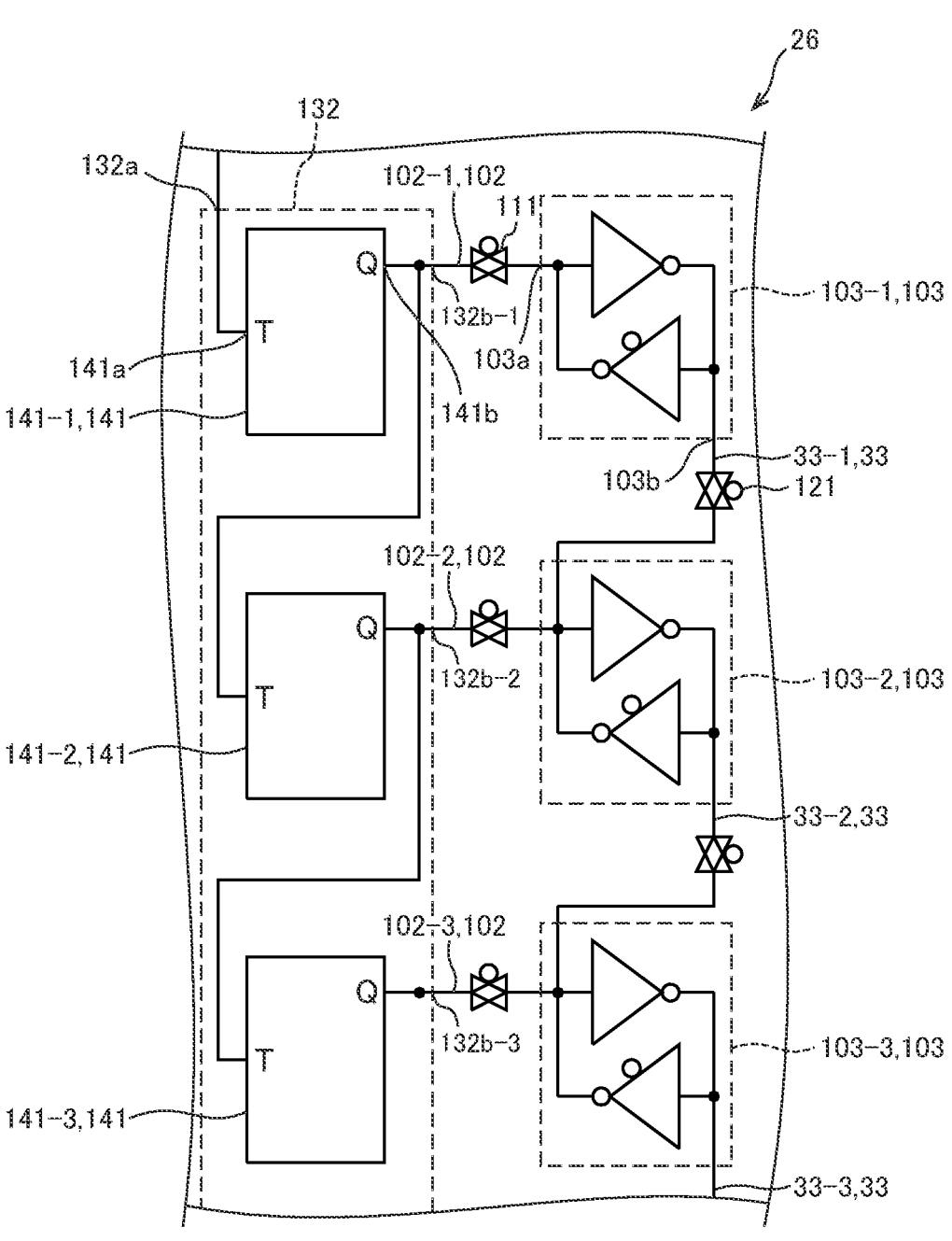
FIG. 16 is a circuit diagram of each column A/D conversion circuit in the CMOS image sensor in accordance with Embodiment 5.
Figure 17:
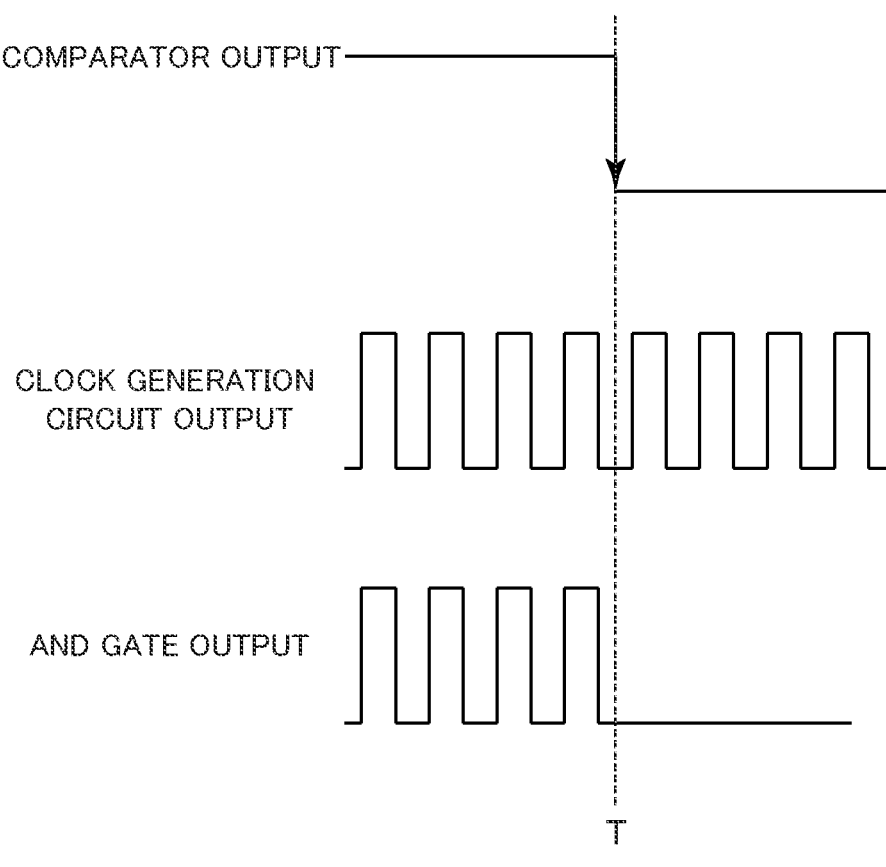
FIG. 17 is a time chart illustrating an exemplary temporal change in the output of a comparator, the output of a clock generation circuit, and the output of an AND gate in the CMOS image sensor in accordance with Embodiment 5.

FIG. 15A is a block diagram of a CMOS image sensor in accordance with Embodiment 5. FIG. 15B is an enlarged view of a part of FIG. 15A. FIG. 16 is a circuit diagram of each column A/D conversion circuit in the CMOS image sensor in accordance with Embodiment 5. FIG. 17 is a time chart illustrating an exemplary temporal change in the output of a comparator, the output of a clock generation circuit, and the output of an AND gate in the CMOS image sensor in accordance with Embodiment 5.

Referring to FIGS. 15A, 15B, and 16, in a CMOS image sensor 5 in accordance with Embodiment 5, each column A/D conversion circuit 26 includes an AND gate 131, a ripple counter 132, first to n-th bit data transfer paths 102-1, 102-2, 102-3, . . . , 102-*n*−1, and 102-*n*, and first to n-th transfer destination storage elements 103-1, 103-2, 103-3, . . . , 103-*n*−1, and 103-*n*. The AND gate 131 has a first input terminal 131*a*, a second input terminal 131*b*, and an output terminal 131*c*. The ripple counter 132 has an input terminal 132*a* and first to n-th output terminals 132*b*-1, 132*b*-2, 132*b*-3, 132*b*-***n*−1, and 132*b*-***n*.

The first to n-th bit data transfer paths 102-1, 102-2, 102-3, . . . , 102-*n*−1, and 102-*n* in the CMOS image sensor 5 in accordance with Embodiment 5 are bit data transfer paths similar to the first to n-th bit data transfer paths 102-1, 102-2, 102-3, . . . , 102-*n*−1, and 102-*n* in the CMOS image sensor 4 in accordance with Embodiment 4. The first to n-th transfer destination storage elements 103-1, 103-2, 103-3, . . . , 103-*n*−1, and 103-*n* in the CMOS image sensor 5 in accordance with Embodiment 5 are transfer destination storage elements similar to the first to n-th transfer destination storage elements 103-1, 103-2, 103-3, . . . , 103-*n*−1, and 103-*n* in the CMOS image sensor 4 in accordance with Embodiment 4.

While both the first input terminal 131*a* and the second input terminal 131*b* are being fed with the first logic value "1," the AND gate 131 outputs the first logic value "1" through the output terminal 131*c*. While either both or one of the first input terminal 131*a* and the second input terminal 131*b* is/are being fed with the second logic value "0," the AND gate 131 outputs the second logic value "0" through the output terminal 131*c*.

The first input terminal 131*a* of the AND gate 131 is electrically connected to the clock generation circuit 23. Hence, the first input terminal 131*a* of the AND gate 131 is fed with a clock generated by the clock generation circuit 23. The second input terminal 131*b* of the AND gate 131 is electrically connected to the output terminal 31*c* of the comparator 31. Hence, the second input terminal 131*b* of the AND gate 131 is fed with the logic value outputted from the output terminal 31*c* of the comparator 31.

Hence, as shown in FIG. 17, while the comparator 31 is outputting the first logic value "1" through the output terminal 31*c* thereof, the AND gate 131 outputs a clock through the output terminal 131*c*. In contrast, while the comparator 31 is outputting the second logic value "0"

through the output terminal 31*c* thereof, the AND gate 131 outputs no clock through the output terminal 131*c*.

The ripple counter 132 counts the number of clock pulses inputted through the input terminal 132*a* to output the first to n-th pieces of bit data representing the counts through the first to n-th output terminals 132*b*-1, 132*b*-2, 132*b*-3, 132*b*-***n*−1, and 132*b*-***n* respectively.

The input terminal 132*a* of the ripple counter 132 is electrically connected to the output terminal 131*c* of the AND gate 131. Hence, the input terminal 132*a* pf the ripple counter 132 is fed with the clock outputted from the output terminal 131*c* of the AND gate 131.

Hence, the ripple counter 132 counts the number of clock pulses outputted from the output terminal 31*c* of the comparator 31 to retain the first to n-th pieces of bit data representing the counts. Hence, the ripple counter 132 stores the first to n-th pieces of bit data similar to the first to n-th pieces of bit data that constitute the count code symbols outputted by the counter 24. The ripple counter 132 outputs the stored, first to n-th pieces of bit data from the first to n-th output terminals 132*b*-1, 132*b*-2, 132*b*-3, 132*b*-***n*−1, and 132*b*-***n* respectively.

The first to n-th bit data transfer paths 102-1, 102-2, 102-3, . . . , 102-*n*−1, and 102-*n* electrically connect the input terminals 103*a* of the first to n-th transfer destination storage elements 103-1, 103-2, 103-3, . . . , 103-*n*−1, and 103-*n* to the first to n-th output terminals 132*b*-1, 132*b*-2, 132*b*-3, 132*b*-***n*−1, and 132*b*-***n* of the ripple counter 132 respectively. Hence, the first to n-th bit data transfer paths 102-1, 102-2, 102-3, . . . , 102-*n*−1, and 102-*n* respectively transfer the first to n-th pieces of bit data stored by the ripple counter 132 from the ripple counter 132 to the first to n-th transfer destination storage elements 103-1, 103-2, 103-3, . . . , 103-*n*−1, and 103-*n*.

The first to n-th transfer destination storage elements 103-1, 103-2, 103-3, . . . , 103-*n*−1, and 103-*n* respectively store the transferred, first to n-th pieces of bit data.

The first to (n−1)-th transfer paths 33-1, 33-2, 33-3, . . . , and 33-*n*−1 respectively transfer the bit data stored in the first to (n−1)-th transfer destination storage elements 103-1, 103-2, 103-3, . . . , and 103-*n*−1 from the first to (n−1)-th transfer destination storage elements 103-1, 103-2, 103-3, . . . , and 103-*n*−1 to the second to n-th transfer destination storage elements 103-2, 103-3, . . . , 103-*n*−1, and 103-*n*.

The n-th transfer path 33-*n* transfers the bit data stored in the n-th transfer destination storage element 103-*n* from the n-th transfer destination storage element 103-*n* to the MUX circuit 27 outside each column A/D conversion circuit 26.

Referring to FIG. 16, the ripple counter 132 includes first to n-th T-type flip-flops 141-1, 141-2, 141-3, . . . . Each T-type flip-flop 141 in the first to n-th T-type flip-flops 141-1, 141-2, 141-3, . . . has a T-input terminal 141*a* and a Q-output terminal 141*b*.

Each T-type flip-flop 141, upon being sequentially fed with the first logic value "1," the second logic value "0," and the first logic value "0" through the T-input terminal 141*a*, inverts the logic value outputted through the Q-output terminal 141*b*.

The T-input terminal 141*a* of the first T-type flip-flop 141-1 is electrically connected to the input terminal 132*a* of the ripple counter 132. The first to n-th T-type flip-flops 141-1, 141-2, 141-3, . . . are electrically connected in series. Therefore, the T-input terminals 141*a* of the second to n-th T-type flip-flops 141-2, 141-3, . . . are electrically connected respectively to the Q-output terminals 141*b* of the first to (n−1)-th T-type flip-flops 141-1, 141-2, 141-3, . . . . The Q-output terminals 141*b* of the first to n-th T-type flip-flops 141-1, 141-2, 141-3, . . . are electrically connected respectively to the first to n-th output terminals 132b-1, 132b-2, 132b-3, . . . , 132b-n−1, and 132b-n of the ripple counter 132.

The controller 71 in the CMOS image sensor 4 in accordance with Embodiment 5 causes each column A/D conversion circuit 26 to perform the A/D conversion operation, the first transfer operation, and the second transfer operation similarly to the controller 71 in the CMOS image sensor 4 in accordance with Embodiment 4, except that the first to n-th pieces of bit data are transferred to the ripple counter 132.

The CMOS image sensor 5 in accordance with Embodiment 5 can cause to simultaneously perform the second transfer operation and perform the A/D conversion operation on a subsequently selected row similarly to the CMOS image sensor 4 in accordance with Embodiment 4. Hence, a pipe line operation becomes possible. Hence, the frame rate of the CMOS image sensor 5 can be increased.

6 Embodiment 6

In the following, a description is given of differences of Embodiment 6 over Embodiment 4. The description may be silent about the structures and features of Embodiment 6 that are the same as those of Embodiment 4.

Figure 18:
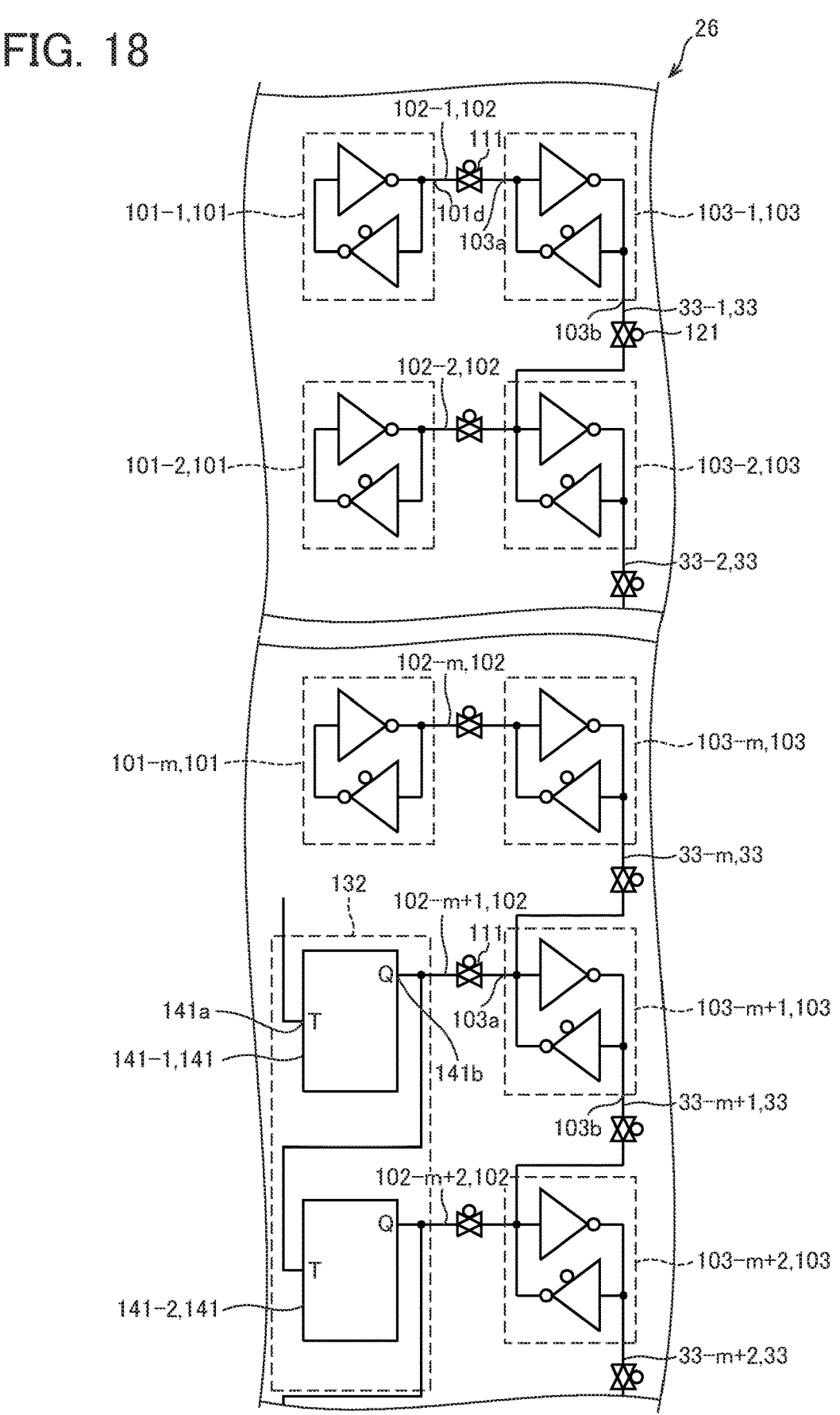
FIG. 18 is a circuit diagram of each column A/D conversion circuit in a CMOS image sensor in accordance with Embodiment 6.

FIG. 18 is a circuit diagram of each column A/D conversion circuit in a CMOS image sensor in accordance with Embodiment 6.

Referring to FIG. 18, in the CMOS image sensor in accordance with Embodiment 6, each column A/D conversion circuit 26 includes m transfer source storage elements 101-1, 101-2, . . . , and 101-m and a ripple counter 132, where m is an integer from 1 to n−1, both inclusive.

The m transfer source storage elements 101-1, 101-2, . . . , and 101-m respectively store m pieces of bit data contained in the first to n-th pieces of bit data.

The ripple counter 132 stores n−m pieces of bit data contained in the first to n-th pieces of bit data.

In the CMOS image sensor 4 in accordance with Embodiment 4, the n transfer source storage elements 101-1, 101-2, 101-3, . . . , 101-n−1, and 101-n store the first to n-th pieces of bit data. In addition, in the CMOS image sensor 5 in accordance with Embodiment 5, the ripple counter 132 stores the first to n-th pieces of bit data. In contrast, in the CMOS image sensor in accordance with Embodiment 6, the m transfer source storage elements 101-1, 101-2, . . . , and 101-m and the ripple counter 132 jointly store the first to n-th pieces of bit data. Hence, it becomes possible to decrease the operating current of each column A/D conversion circuit 26.

The first to n-th bit data transfer paths 102-1, 102-2, . . . , 102-m, 102-m+1, 102-m+2, respectively transfer the first to n-th pieces of bit data stored in the m transfer source storage elements 101-1, 101-2, . . . , and 101-m and the ripple counter 132 from the m transfer source storage elements 101-1, 101-2, . . . , and 101-m and the ripple counter 132 to the first to n-th transfer destination storage elements 103-1, 103-2, . . . , 103-m, 103-m+1, 103-m+2, . . . .

The controller 71 in the CMOS image sensor in accordance with Embodiment 6 causes each column A/D conversion circuit 26 to perform the A/D conversion operation, the first transfer operation, and the second transfer operation similarly to the controller 71 in the CMOS image sensor 4 in accordance with Embodiment 4, except that the first to n-th pieces of bit data are transferred to the m transfer source storage elements 101-1, 101-2, . . . , and 101-m and the ripple counter 132.

The CMOS image sensor in accordance with Embodiment 6 can cause to simultaneously perform the second transfer operation and perform the conversion operation on a subsequently selected row similarly to the CMOS image sensor 4 in accordance with Embodiment 4. Hence, pipe line operation becomes possible. Hence, the frame rate of CMOS image sensor can be increased.

7 Embodiment 7

In the following, a description is given of differences of Embodiment 7 over Embodiment 1. The description may be silent about the structures and features of Embodiment 7 that are the same as those of Embodiment 1.

Figure 19:
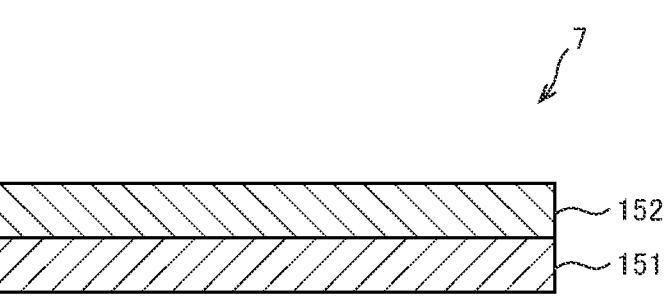
FIG. 19 is a schematic cross-sectional view of a CMOS image sensor in accordance with Embodiment 7.

FIG. 19 is a schematic cross-sectional view of a CMOS image sensor in accordance with Embodiment 7.

A CMOS image sensor 7 in accordance with Embodiment 7 shown in FIG. 19 has a backside illumination (BSI) stack chip structure. Therefore, referring to FIG. 19, the CMOS image sensor 7 includes a first BSI stack chip 151 on which the p×q pixels 11 are mounted and a second BSI stack chip 152 on which the image sensor circuit 13 is mounted. The second BSI stack chip 152 is alternatively referred to as, for example, the logic chip because the image sensor circuit 13 is a peripheral circuitry that provides a logic circuit.

Unlike a front-side illumination (FSI) single chip, the second BSI stack chip 152 do not include the p×q pixels 11, which constraint the layout of the p column A/D conversion circuits 26 and the post-stage logic circuit 29. Therefore, in the second BSI stack chip 152, the layout of the p column A/D conversion circuits 26 and the post-stage logic circuit 29 is possible without the layout of the p column A/D conversion circuits 26 and the post-stage logic circuit 29 being constrained by the p×q pixels 11.

Figure 20:
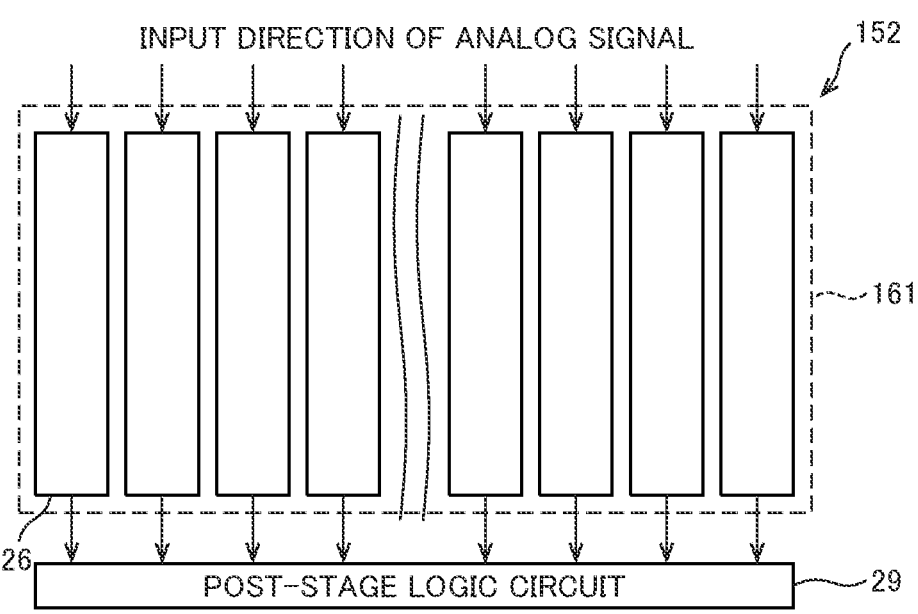
FIG. 20 is a schematic plan view of a second BSI stack chip in the CMOS image sensor in accordance with Embodiment 7.

FIG. 20 is a schematic plan view of a second BSI stack chip in the CMOS image sensor in accordance with Embodiment 7.

Referring to FIG. 20, in the second BSI stack chip 152, the p column A/D conversion circuits 26 form a block 161. The block 161 is shaped like a rectangle with longer sides and shorter sides in a plan view. The p column A/D conversion circuits 26 are arranged in a direction parallel to these longer sides. Therefore, the p, n-th storage elements 32-n, which are included respectively in the p column A/D conversion circuits 26 to output the first to n-th pieces of bit data, are arranged along the longer sides.

The post-stage logic circuit 29 is arranged along the longer sides. Hence, the post-stage logic circuit 29 is arranged along these p, n-th storage elements 32-n. Hence, distance can be reduced from the n-th storage elements 32-n that output the first to n-th pieces of bit data to the post-stage logic circuit 29 that processes the first to n-th pieces of bit data. Hence, wring can be reduced, and the wring occupy a smaller area.

The wring from the block 161 toward the post-stage logic circuit 29 has an arrangement pitch that is in accordance with the arrangement pitch of the p column A/D conversion circuits 26. Hence, the wiring can be restrained from being densely provided. In addition, the wiring can be efficiently laid out by utilizing the area between the block 161 and the post-stage logic circuit 29.

The present disclosure is not limited to the description of the embodiments and examples above. Any structure detailed in the embodiments and examples may be replaced by a practically identical structure, a structure that delivers the same effect and function, or a structure that achieves the same purpose.

What is claimed is:

1. An image sensor circuit comprising a plurality of column analog/digital conversion circuits, each comprising:

first to n-th storage elements configured to store, respectively, first to n-th pieces of bit data that form analog/digital-converted data obtained by analog/digital-converting analog signals outputted by pixels, where n is an integer greater than or equal to 2;

first to (n−1)-th transfer paths configured to respectively transfer first to (n−1)-th pieces of bit data stored in first to (n−1)-th storage elements from the first to (n−1)-th storage elements to second to n-th storage elements; and an n-th transfer path configured to transfer the n-th piece of bit data stored in the n-th storage element from the n-th storage element to outside the plurality of column analog/digital conversion circuits, wherein each of the first to n-th storage elements includes a first inverter and a second inverter, and among the first to n-th storage elements, a first storage element and a second storage element that are adjacent to each other are connected, such that the second inverter of the first storage element and the first inverter of the second storage element are connected in parallel.

2. The image sensor circuit according to claim 1, wherein the first to n-th storage elements are latch circuits.

3. The image sensor circuit according to claim 1, wherein each of the first to n-th storage elements has a node that has an electrical potential based on a piece of bit data stored in a corresponding storage element, and the first to (n−1)-th transfer paths include, respectively, first to (n−1)-th switch circuits, each of which assumes a state selected from an ON state, in which nodes of the second to n-th storage elements are electrically connected to nodes of the first to (n−1)-th storage elements, and an OFF state, in which the nodes of the second to n-th storage elements are electrically disconnected from the nodes of the first to (n−1)-th storage elements.

4. The image sensor circuit according to claim 1, further comprising:

a controller configured to simultaneously cause the plurality of column analog/digital conversion circuits to perform a transfer operation of outputting the first to n-th pieces of bit data from the first to n-th storage elements and cause at least two of the plurality of column analog/digital conversion circuits to perform the transfer operation, by controlling the first to n-th transfer paths.

5. The image sensor circuit according to claim 1, further comprising a shift register circuit configured to be serially fed with the first to n-th pieces of bit data and parallelly output the first to n-th pieces of bit data.

6. The image sensor circuit according to claim 5, further comprising a multiplex circuit configured to be serially fed with the first to n-th pieces of bit data from at least two of the plurality of column analog/digital conversion circuits and serially input, to the shift register circuit, the first to n-th pieces of bit data serially fed from a column analog/digital conversion circuit selected from the at least two of the plurality of column analog/digital conversion circuits.

7. The image sensor circuit according to claim 1, wherein each of the plurality of column analog/digital conversion circuits includes: first to n-th transfer source storage elements configured to respectively store the first to n-th pieces of bit data; and first to n-th bit data transfer paths configured to respectively transfer the first to n-th pieces of bit data from the first to n-th transfer source storage elements to the first to n-th storage elements, the image sensor circuit further comprising a controller configured to cause the plurality of column analog/digital conversion circuits to simultaneously perform an analog/digital conversion operation of storing the first to n-th pieces of bit data in the respective, first to n-th transfer source storage elements and perform a transfer operation of outputting the first to n-th pieces of bit data from the n-th storage elements, by controlling the first to n-th transfer paths and the first to n-th bit data transfer paths.

8. The image sensor circuit according to claim 1, wherein each of the plurality of column analog/digital conversion circuits includes: a ripple counter configured to store the first to n-th pieces of bit data; and first to n-th bit data transfer paths configured to respectively transfer the first to n-th pieces of bit data from the ripple counter to the first to n-th storage elements, the image sensor circuit further comprising a controller configured to cause the plurality of column analog/digital conversion circuits to simultaneously perform an analog/digital conversion operation of storing the first to n-th pieces of bit data in the ripple counter and perform a transfer operation of outputting the first to n-th pieces of bit data from the n-th storage elements, by controlling the first to n-th transfer paths and the first to n-th bit data transfer paths.

9. The image sensor circuit according to claim 1, wherein each of the plurality of column analog/digital conversion circuits includes: m transfer source storage elements configured to respectively store m pieces of bit data contained in the first to n-th pieces of bit data, where m is an integer from 1 to n−1, both inclusive; a ripple counter configured to store n-m pieces of bit data contained in the first to n-th pieces of bit data; and first to n-th bit data transfer paths configured to respectively transfer the first to n-th pieces of bit data from the m transfer source storage elements and the ripple counter to the first to n-th storage elements, the image sensor circuit further comprising a controller configured to cause the m transfer source storage elements and the ripple counter to simultaneously perform an analog/digital conversion operation of storing the first to n-th pieces of bit data and a transfer operation of outputted the first to n-th pieces of bit data from the n-th storage elements, by controlling the first to n-th transfer paths and the first to n-th bit data transfer paths.

10. The image sensor circuit according to claim 1, further comprising:

a post-stage logic circuit configured to be fed with the first to n-th pieces of bit data and disposed along a plurality of n-th storage elements, including the n-th storage element, included, respectively, in the plurality of column analog/digital conversion circuits, wherein the image sensor circuit is mounted on a backside illumination stack chip.

* * * * *